(12) United States Patent
Furuya et al.

(10) Patent No.: US 7,903,325 B2
(45) Date of Patent: Mar. 8, 2011

(54) WAVELENGTH CONVERTER AND IMAGE DISPLAY DEVICE

(75) Inventors: Hiroyuki Furuya, Nara (JP); Kiminori Mizuuchi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 446 days.

(21) Appl. No.: 12/280,220

(22) PCT Filed: Feb. 2, 2007

(86) PCT No.: PCT/JP2007/051780
§ 371 (c)(1),
(2), (4) Date: Aug. 21, 2008

(87) PCT Pub. No.: WO2007/097177
PCT Pub. Date: Aug. 30, 2007

(65) Prior Publication Data
US 2010/0290105 A1    Nov. 18, 2010

(30) Foreign Application Priority Data

Feb. 24, 2006  (JP) ................................ 2006-048207

(51) Int. Cl.
*G02F 1/35* (2006.01)
*G02F 1/37* (2006.01)

(52) U.S. Cl. ............... 359/328; 372/6; 372/22; 372/102; 372/105

(58) Field of Classification Search .......... 359/326–332; 372/6, 21, 22, 98, 102, 105; 353/31
See application file for complete search history.

(56) References Cited

U.S. PATENT DOCUMENTS

| 5,386,426 | A | 1/1995 | Stephens |
| 6,996,140 | B2 * | 2/2006 | Waarts et al. ................... 372/21 |
| 7,576,908 | B2 * | 8/2009 | Shikii et al. ................... 359/326 |
| 2006/0227293 | A1 | 10/2006 | Kasazumi et al. |
| 2009/0279573 | A1 * | 11/2009 | Mizuuchi et al. ................. 372/6 |

FOREIGN PATENT DOCUMENTS

| JP | 5-7038 | 1/1993 |
| JP | 6-181356 | 6/1994 |
| JP | 2000-339735 | 12/2000 |
| JP | 2004-170741 | 6/2004 |
| JP | 2005-19540 | 1/2005 |

(Continued)

OTHER PUBLICATIONS

International Search Report issued Mar. 13, 2007 in International (PCT) Application No. PCT/JP2007/051780.
Hiroshi Takuma et al., "Development of Linearly-Polarized Ytterbium Doped Fiber Laser", Extended Abstracts (The 52$^{nd}$ Spring meeting, 2005); The Japan Society of Applied Physics and Related Societies No. 3, Mar. 29, 2005, p. 1218.

*Primary Examiner* — Daniel Petkovsek
(74) *Attorney, Agent, or Firm* — Wenderoth, Lind & Ponack, L.L.P.

(57) ABSTRACT

Since the absorption of a fundamental wave by a fiber increases if it is tried to obtain a wavelength conversion light of watt-class high output, the fiber length needs to be shortened. However, since oscillation efficiency conversely decreases if the fiber length is shortened, it is difficult to obtain a high-output fundamental wave. Thus, by reflecting an excitation light incident on the fiber in the fiber, the excitation light is efficiently absorbed to amplify the fundamental wave with a high gain. Further, by shortening the fiber length, the absorption of the fundamental wave is also reduced to improve a fundamental wave output. Consequently, a wavelength converter capable of ensuring a stable high output up to watt-class is achieved.

27 Claims, 17 Drawing Sheets

FOREIGN PATENT DOCUMENTS

| | | |
|---|---|---|
| JP | 2005-79197 | 3/2005 |
| JP | 2005-109185 | 4/2005 |
| JP | 2005-150304 | 6/2005 |
| JP | 2005-150365 | 6/2005 |
| WO | 2005/008330 | 1/2005 |

* cited by examiner

WAVELENGTH CONVERTER AND IMAGE DISPLAY DEVICE

TECHNICAL FIELD

The present invention relates to a wavelength converter for obtaining a stable visible laser light of high output by combining a fiber laser and a wavelength conversion element and an image display device using this wavelength converter as a light source.

BACKGROUND ART

A visible light source having strong monochromaticity and capable of outputting a W (watt)-class high output is required in realizing a large-size display, a high-luminance display and the like. For a red light source out of three primary colors of red, green and blue, a red high-output semiconductor laser used in a DVD recorder or the like can be utilized as a small-size light source with high productivity. However, it is difficult to realize a green or blue light source by a semiconductor laser or the like, wherefore small-size green and blue light sources with high productivity are being demanded. Particularly, it is highly difficult to realize a green light source since there is no suitable material used for a semiconductor laser.

A wavelength converter as a combination of a fiber laser and a wavelength conversion element is realized as a low-output visible light source of such a type. Green and blue small-size light sources using a semiconductor laser as a light source of excitation light for exciting a fiber laser and a nonlinear optical crystal as a wavelength conversion element are well known.

However, in order to obtain green and blue lights of W-class high output from such a wavelength converter, several problems need to be solved. FIG. 16 shows the schematic construction of a conventional wavelength converter 20. There is described a case where a green output light is, for example, obtained by this construction. The wavelength converter 20 shown in FIG. 16 is provided with a fiber laser 15 for outputting a fundamental wave, a wavelength conversion element 1 for converting the fundamental wave into a green laser light and a lens 2 for condensing a fundamental wave output on an end surface of the wavelength conversion element 1.

Next, a basic laser operation of the fiber laser 15 is described. First of all, an excitation light from an excitation laser light source 3 is incident on one end 4a of a fiber 4 in FIG. 16. After the incident excitation light is absorbed by a laser active material contained in the fiber 4, a seed light of the fundamental wave is generated in the fiber 4. This seed light of the fundamental wave reciprocates many times in a laser resonator using a fiber grating 4b formed in the fiber 4 and a fiber grating 5b formed in a fiber 5 different from the fiber 4 as a pair of reflection mirrors. Simultaneously, the seed light is amplified with a gain given by the laser active material contained in the fiber 4 to increase its light intensity and is also wavelength-selected to reach a laser oscillation. The fibers 4, 5 are connected by a connecting portion 6, and the laser light source 3 is current-driven by an excitation laser current source 7.

Next, a basic operation of the wavelength converter 20 is described. The fundamental wave is outputted from the fiber laser 15 as described above and incident on the wavelength conversion element 1 via the lens 2. The fundamental wave from the fiber laser 15 is converted into a harmonic by the nonlinear optical effect of the wavelength conversion element 1. This converted harmonic is partly reflected by a beam splitter 8, but the transmitted harmonic becomes a green laser light as an output light of the wavelength converter 20.

The harmonic partly reflected by the beam splitter 8 is utilized by being converted into an electrical signal after being received by a light receiving element 9 for monitoring the output light of the wavelength converter 20. An output controller 10 regulates a drive current of the laser light source 3 using the excitation laser current source 7 such that the intensity of this converted signal becomes an intensity to give a desired output of the wavelength converter 20. Then, the intensity of the excitation light from the laser light source 3 is adjusted and the output intensity of the fundamental wave of the fiber laser 15 is adjusted, with the result that the output intensity of the wavelength converter 20 is adjusted. In this way, a so-called automatic power control (hereinafter, abbreviated as "APC"), in which the output intensity of the wavelength converter is kept constant, stably operates.

It is possible to obtain a green high-output laser light of several 100 mW by such a construction, but it is difficult to obtain a W-class green high-output laser light. In other words, the outputs of the fundamental wave of the fiber laser and the excitation light need to be increased in order to increase the light output of the wavelength converter. However, in the construction of the conventional fiber laser shown in FIG. 16, the absorption of the fundamental wave increases in proportion to the fiber length even if it is tried to increase the gain of the fundamental wave by increasing the length of the fiber. Thus, if the fiber length exceeds a certain length, the fiber laser does not reach a laser oscillation any longer.

The absorption of the fundamental wave by the fiber notably increases as the oscillation wavelength of the fiber laser decreases. FIG. 17 shows an optimal fiber length in relation to the oscillation wavelength of the conventional fiber laser. AS the oscillation wavelength decreases from 1080 nm to 1020 nm, the optimal fiber length also decreases to shorten a section where the seed light is amplified, wherefore the output of the fundamental wave obtained from the fiber laser decreases.

In order to increase the output of the fundamental wave in such a situation, the output of the excitation light is increased to excite the fiber laser by setting the fiber length to a suitable length. However, since the fiber length is not sufficiently long, the excitation light cannot be completely absorbed, leaving the excitation light of the considerable output intensity. Accordingly, in the case of obtaining a W-class high output from such a wavelength converter using the fiber laser, a problem of deteriorating the fiber notably occurs due to a temperature increase or the like caused by an increase of the light output as the sum of the fundamental wave and the excitation light in the fiber and an increase of the light absorption. There is also a problem of damaging the excitation laser light source by the increased return light of the fundamental wave resulting from the increase of the light output in the fiber.

Various measures are taken to solve these problems. An example of preventing the damage of a laser light source, a wavelength selection filter is inserted in a light path so that a signal light amplified in a fiber and having a high peak light output does not return to an excitation laser light source in a fiber laser for optical communication. By utilizing a slight difference between an excitation light and the signal light, this wavelength selection filter reflects the signal light although transmitting the excitation light. Thus, only the excitation light is emitted from the excitation laser light source and no amplified signal light returns, wherefore the laser light source is not damaged (see, for example, patent literature 1).

On the other hand, there is an example of elaborating the structure of a fiber doped with a rare earth element as a laser active material in order to prevent the deterioration of a fiber. Specifically, in a fiber laser for outputting a fundamental wave having a wavelength in a 3 μm band used in the medical field, the absorptance of the excitation light is optimized by determining the range of the doped amount of the rare earth element and by adjusting the diameters of a core and a cladding of the fiber within specific ranges. By adopting such a structure, a high light output of 3 W is obtained without deteriorating the fiber laser (see, for example, patent literature 2).

In an optical communication field or the like, a connection structure of a fiber and a guide fiber is elaborated to prevent the deterioration of the fiber when an excitation light is incident on the fiber, to which a signal light is transmitted, via the guide fiber (see, for example, patent literature 3).

The deterioration of a fiber is also prevented by surrounding a core part of the fiber by an outer core made of a material having a higher refractive index than the core part and by leading the light to the outside of the fiber to suppress an increase of the light output if the light output in the fiber has increased (see, for example, patent literature 4).

In order to solve a problem different from that of the present invention, there has been also proposed a construction for reflecting an excitation light in a fiber to separate an oscillating light and an excitation light (see, for example, patent literature 5).

However, in the above conventional wavelength converters, the light output of the fiber laser as the fundamental wave is only 2 to 3 W and it is difficult to obtain an output of the fundamental wave exceeding 5 W. Thus, green and blue laser lights of W-class high output cannot be obtained. Even if the fiber length of the fiber laser is simply increased for the purpose of increasing the output of the fundamental wave by increasing the gain of the fiber laser, the absorption of the fundamental wave by the fiber increases in proportion to the fiber length, wherefore a large light output cannot be obtained.

On the other hand, since the absorption of the fundamental wave by the fiber becomes more notable as the oscillation wavelength of the fiber laser decreases from 1070 nm, the fiber length needs to be decreased to obtain a light of 1070 nm or shorter. However, if the fiber is shortened, efficiency decreases and it becomes difficult to obtain high efficiency, for example, in the case of producing a light having a wavelength of around 1030 nm.

Accordingly, there has been a problem of being difficult to obtain a W-class short wavelength green laser output light, which is supposed to be obtained by shortening the wavelength of the fundamental wave of the fiber laser.

Patent Literature 1:
  Japanese Unexamined Patent Publication No. H05-7038
Patent Literature 2:
  Japanese Unexamined Patent Publication No. 2005-79197
Patent Literature 3:
  Japanese Unexamined Patent Publication No. 2005-19540
Patent Literature 4:
  Japanese Unexamined Patent Publication No. 2004-170741
Patent Literature 5:
  Japanese Unexamined Patent Publication No. 2005-109185

DISCLOSURE OF THE INVENTION

An object of the present invention is to provide a wavelength converter capable of stably obtaining green and blue laser lights of W-class high output and a high-luminance image display device using this wavelength converter.

One aspect of the present invention is directed to a wavelength converter, comprising a laser resonator including a fiber containing a laser active material and formed with a fiber grating; a laser light source for emitting an excitation light to the fiber; and a wavelength conversion element for converting a fundamental wave of a laser light emerging from the laser resonator into a harmonic, wherein the laser resonator includes a first reflection surface arranged near the fiber grating and a second reflection surface arranged near the laser light source; and the excitation light emitted from the laser light source makes a round trip between the second and first reflection surfaces by being reflected by the first reflection surface after being incident through the second reflection surface.

In the above wavelength converter, the excitation light incident on the fiber from the laser light source is reflected by the first reflection surface of the fiber to make a round trip in the fiber after being incident on the second reflection surface of the fiber, thereby being efficiently absorbed by an energy level involving the laser active material. Conventionally, the fiber laser has needed to have such a length as to substantially entirely absorb the excitation light but, by reflecting the excitation light in the fiber laser, the excitation light is absorbed with half the length. Thus, the fiber laser efficiently absorbs the excitation light with half the length of the conventional one and oscillates the fundamental wave with a high gain to efficiently emit the fundamental wave, wherefore the wavelength converter can be constructed to have a small construction, high efficiency and lower power consumption.

BRIEF DESCRIPTION OF THE DRAWINGS

FIG. 5 is a graph showing a phase-matching wavelength change amount in the wavelength conversion element and a reflection wavelength change amount in the fiber grating in relation to a fundamental wave output, FIG. 6 are graphs showing dependencies of the light output of the fundamental wave in relation to the fiber length, wherein FIG. 11 is a schematic diagram showing the construction of a wavelength converter according to a third embodiment of the invention, FIG. 12 are diagrams showing the construction of an excitation laser light source used in a wavelength converter according to a fourth embodiment of the invention, wherein

BEST MODES FOR EMBODYING THE INVENTION

Figure 1:
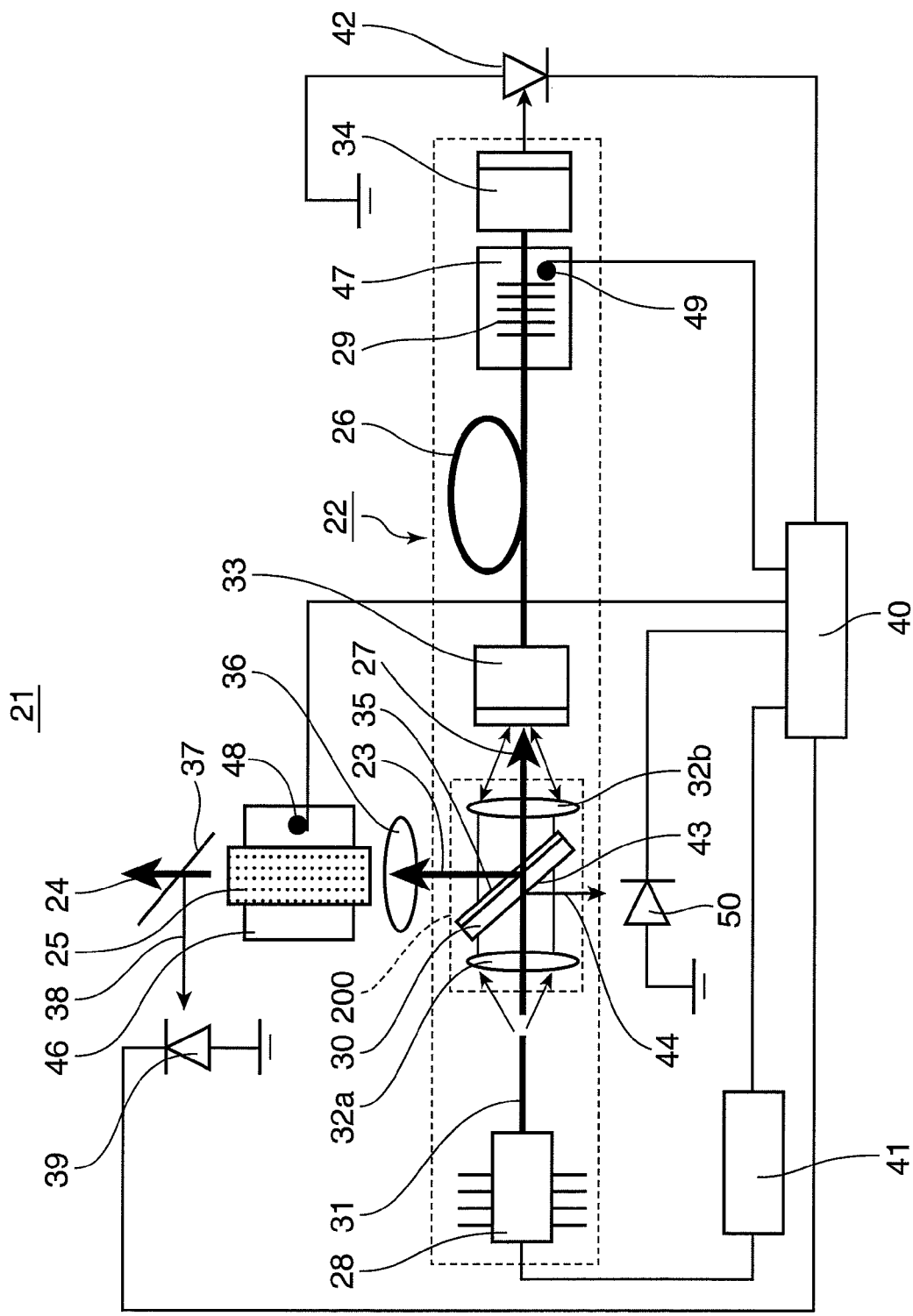
FIG. 1 is a schematic diagram showing the construction of a wavelength converter according to a first embodiment of the invention.

Hereinafter, wavelength converters and an image display device according to embodiments of the present invention are described with reference to the accompanying drawings. It should be noted that the same parts are identified by the same reference numerals and parts identified by the same reference numerals in the drawings may not be repeatedly described.

First Embodiment

FIG. 1 shows the construction of a wavelength converter according to a first embodiment of the present invention. The wavelength converter 21 shown in FIG. 1 is basically provided with a fiber laser 22, a wavelength conversion element 25 for converting a fundamental wave 23 emitted from the fiber laser 22 into a harmonic output 24 and a condenser lens 36 arranged between the fiber laser 22 and the wavelength conversion element 25.

Main constitute elements of the fiber laser 22 are a laser resonator made of a fiber 26 containing a laser active material and having a fiber grating 29 partly formed, a laser light source 28 for emitting an excitation light 27 to the fiber 26, an optical system 200 including an extraction mirror 30 for extracting the fundamental wave 23 emerging from the fiber 26 in a direction toward the wavelength conversion element 25, and first and second reflection surfaces 33, 34 formed at respective end surfaces of the fiber 26. Here, the laser resonator formed by the fiber 26 emits the fundamental wave 23 after amplifying it using the fiber grating 29 and the second reflection surface 33 formed on one end surface of the fiber 26 as a pair of reflection surfaces.

Specifically, the fiber laser 22 includes the laser light source 28 for outputting the excitation light 27 to the fiber 26, the fiber 26 internally formed with the fiber grating 29 for reflecting the fundamental wave by selecting the wavelength of the fundamental wave and having the first and second reflection surfaces 33, 34 formed on the respective end surfaces, and the optical system 200 including the extraction mirror 30 for introducing the fundamental wave 23 as an output to the wavelength conversion element 25. The extraction mirror 30 functions to couple the laser light source 28 and the fiber 26 by transmitting the excitation light 27 and to introduce the fundamental wave 23 emerging from the fiber 26 to the wavelength conversion element 25 by reflecting this fundamental wave 23.

By employing the fiber grating 29 as the one reflection surface of the laser resonator of the fiber laser 22, it becomes possible to select an arbitrary reflection center wavelength, wherefore an oscillation center wavelength can be arbitrarily selected and a fundamental wave in a wavelength band of 0.05 to 0.2 nm required by the wavelength conversion element 25 can be generated. It is difficult to obtain a fundamental wave in this band with a reflection mirror using a dielectric multilayer film. In the case of using a reflection surface having a wide band such as a dielectric multilayer film, oscillation occurs at such a wavelength where the gain of the fiber is high (oscillation at a wavelength where oscillation is likely to occur), wherefore arbitrary wavelength selection is difficult and the oscillation wavelength becomes unstable.

Further, by forming the laser resonator as a closed system in the fiber 26, an output reduction with time and an output variation caused by an increase of a resonator loss due to dust from the outside or the misalignment of the reflection surfaces can be suppressed.

Next, a basic laser operation of the fiber laser 22 of FIG. 1 is described. In FIG. 1, the excitation light 27 from the pigtail laser light source 28 is converted into a parallel light by a collimator lens 32a of the optical system 200 after propagating in a fiber 31 belonging to the laser light source 28, and then passes through the extraction mirror 30. The excitation light 27 is further condensed by a condenser lens 32b of the optical system 200 to be incident on the fiber 26 through the second reflection surface 33 of the fiber 26. The incident excitation light 27 propagates in the fiber 26 while being absorbed by the laser active material contained in the fiber 26. After passing the fiber grating 29, the excitation light 27 is reflected by the first reflection surface 34 to return in the fiber 26 while being absorbed by the laser active material and is lost by being almost entirely absorbed by the laser active material during a round trip before reaching the second reflection surface 33. An excitation light is conventionally absorbed while propagating in one direction in a fiber. Thus, a gain for amplifying a fundamental wave decreases in a propagation direction of the excitation light. On the other hand, since the excitation light 27 is absorbed while making a round trip in the fiber 26 in this embodiment, the gain for amplifying the fundamental wave is uniformly high in the fiber 26 as compared with the conventional art.

In this way, the excitation light 27 is almost entirely absorbed while making a round trip in the fiber 26 and a seed light of the fundamental wave 23 is generated in the fiber 26 with the gain for amplifying the fundamental wave uniformly increased in the fiber 26. This seed light of the fundamental wave 23 is amplified in this laser resonator using the second reflection surface 33 and the fiber grating 29 of the fiber 26 as a pair of reflection surfaces of the laser resonator and is reflected many times to make round trips while increasing the intensity thereof, thereby reaching a laser oscillation.

The fiber 26 used in this embodiment is, for example, a double-clad polarization maintaining fiber capable of propagating the high-output excitation light 27. Accordingly, the excitation light 27 is absorbed by the laser active material contained in the fiber 26 while propagating a relative wide area of the core of the fiber 26 and an inner cladding. Because of propagation in the wide area, it is also possible to use the high-output excitation light 27.

The fundamental wave 23 outputted from the fiber 26 in this way is converted into a parallel light by the condenser lens 32b after emerging from the second reflection surface 33, and reaches the extraction mirror 30. A multilayer film 35 for wavelength selection is formed on one surface of the extraction mirror 30. This multilayer film 35 is formed to transmit lights having the wavelength of the excitation light 27 while reflecting lights having the wavelength of the fundamental wave 23. Thus, the fundamental wave 23 emerging from the second reflection surface 33 is reflected by the multilayer film 35 on the surface of the extraction mirror 30 to be introduced to the wavelength conversion element 25.

In this embodiment, it is preferable to form the extraction mirror 30 by a narrow band transmission filter and to insert it, for example, at an angle of 40 to 50° to the excitation light 27. The insertion at 40 to 50° is for preventing a part of the excitation light 27 reflected by the excitation mirror 30 from returning to the laser light source 28. Further, since an optical path of the light emerging from the fiber 26 and that of the light emerging from the wavelength conversion element 25 can be made orthogonal to each other, the wavelength converter 21 can be made smaller in the case of being formed into a module. Separately from the extraction mirror 30, a narrow band transmission filter may be inserted between the extraction mirror 30 and the collimator lens 32a.

By adopting such a construction, a transmission wavelength of the transmission filter can be adjusted to a peak wavelength of absorption of an Yb-doped fiber of 915 nm or 976 nm, for example, in the case where the fiber 26 is an Yb-doped fiber. Further, the band comes to have a half bandwidth of the narrow band of 2 to 3 mm centered on the transmission wavelength of 915 nm or 976 nm. When the excitation light 27 as a light in such a narrow band passes through the extraction mirror 30 to be incident on the fiber 26, a part of the excitation light 27 is reflected by the second reflection surface 33 as the end surface of the fiber 26. The reflected part of the excitation light 27 propagates in a reverse direction along the same optical path to return to the laser light source 28, and the oscillation wavelength of the laser light source 28 is locked by the light in the narrow band, which is the part of the returned excitation light 27. The excitation laser light source 28 originally has a relatively wide wavelength half width of 5 nm or longer for multimode oscillation. If an optical component for locking a wavelength in a narrow band such as a transmission filter is used, the laser light source has a narrow band whose wavelength half width is 2 to 3 nm. By this effect, the wavelength half width of the excitation light 27 decreases, the efficiency of the laser light source 28 itself increases and, in addition, the excitation light 27 is more efficiently absorbed in the fiber laser 22, wherefore the conversion of the light output from the excitation light 27 into the fundamental wave 23 can be realized with higher efficiency. Since the efficiency of the fiber 26 in absorbing the excitation light 27 is high and the fiber length can be shortened in this embodiment, a more efficient fiber laser can be fabricated when the fiber is used upon generating a light having a wavelength of 1030 nm or shorter. At this time, the reflectance of the second reflection surface 33 as the end surface of the fiber 26 reflecting the excitation light 27 is preferably set at least to about 3 to 8%. The emitter width of an excitation LD is preferably 50 to 200 μm, more preferably about 50 to 100 μm since a wavelength is more easily locked as the number of oscillation modes decreases.

Next, a basic operation of the wavelength conversion element 25 is described. The laser light of the fundamental wave 23 is outputted by the fiber laser 22 as described above and condensed by the condenser lens 36 to be incident on the wavelength conversion element 25. When this fundamental wave 23 from the fiber laser 22 becomes an incident wave and is converted by the nonlinear optical effect of the wavelength conversion element 25, the harmonic output 24 having half the wavelength of the fundamental wave 23 is obtained. This converted harmonic output 24 is partly reflected by a beam splitter 37, but the transmitted harmonic output 24 almost entirely exits as an output light of the wavelength converter 21.

The harmonic output 38 partly reflected by the beam splitter 37 is received by a light receiving element 39 for monitoring the output light of the wavelength converter 21 and utilized by being converted into an electrical signal. An output controller 40 regulates a drive current of the laser light source 28 by means of an excitation laser current source 41 such that the intensity of this converted signal becomes an intensity to give a desired output of the wavelength converter 21. Then, the intensity of the excitation light 27 from the laser light source 28 is adjusted to adjust the output intensity of the fundamental wave 23 of the fiber laser 22, with the result that the output intensity of the wavelength converter 21 is adjusted. In this way, a so-called automatic power control (hereinafter, abbreviated as "APC"), in which the output intensity of the wavelength converter 21 is kept constant, stably operates.

In order to more accurately control the output intensity of the wavelength converter 21 through the APC operation, a light receiving element 42 may be arranged at an outer side of the first reflection surface 34 formed on the other end surface of the fiber 26. In this way, it becomes possible to detect a small amount of the fundamental wave 23 leaking through the fiber grating 29 without being reflected by the fiber grating 29 or a small amount of the excitation light 27 leaking through the first reflection surface 34 without being reflected by the first reflection surface 34. By respectively estimating the intensities of the entire excitation light 27 and fundamental wave 23 based on this detection data, the output controller 40 regulates the drive current of the laser light source 28 using the excitation laser current source 41 and performs the APC operation to keep the output intensity of the wavelength converter 21 constant. Similarly, a tiny part 44 of the excitation light 27 leaking through a surface 43 of the extraction mirror 30 opposite to the surface where the multilayer film 35 for reflecting the fundamental wave 23 is formed is detected by a light receiving element 50, whereby the output controller 40 may perform the APC operation by estimating the intensity of the entire excitation light 27 from the part 44 of the excitation light 27.

Next, a specific operation of the wavelength converter 21 of FIG. 1 for obtaining a high-output green laser light (hereinafter, "G-light") is described.

In FIG. 1, a rare earth element Yb is doped as a laser active material at a concentration of 1200 ppm in the core part of the fiber 26 of the fiber laser 22. A semiconductor laser having a wavelength of 915 nm, a threshold current of 400 mA and a maximum light output of 10 W is used as the laser light source 28 for fiber excitation. The excitation light 27 having a wavelength of 915 nm is incident on the fiber 26, reflected by the first reflection surface 34 having a reflectance of 98% and entirely absorbed until making a round trip in the fiber 26 to reach the second reflection surface 33. As a result, when the excitation light 27 from the laser light source 28 is incident on the fiber 26, it is absorbed by the core part and a stimulated emission occurs from the fiber 26 at a wavelength of about 1060 nm utilizing a Yb level of the core part. This stimulated emission light of about 1060 nm propagates while being amplified by the gain obtained by the absorption of the excitation light 27 in the fiber 26, and becomes the fundamental wave 23 as an infrared laser light having a wavelength of about 1060 nm.

Figure 2:
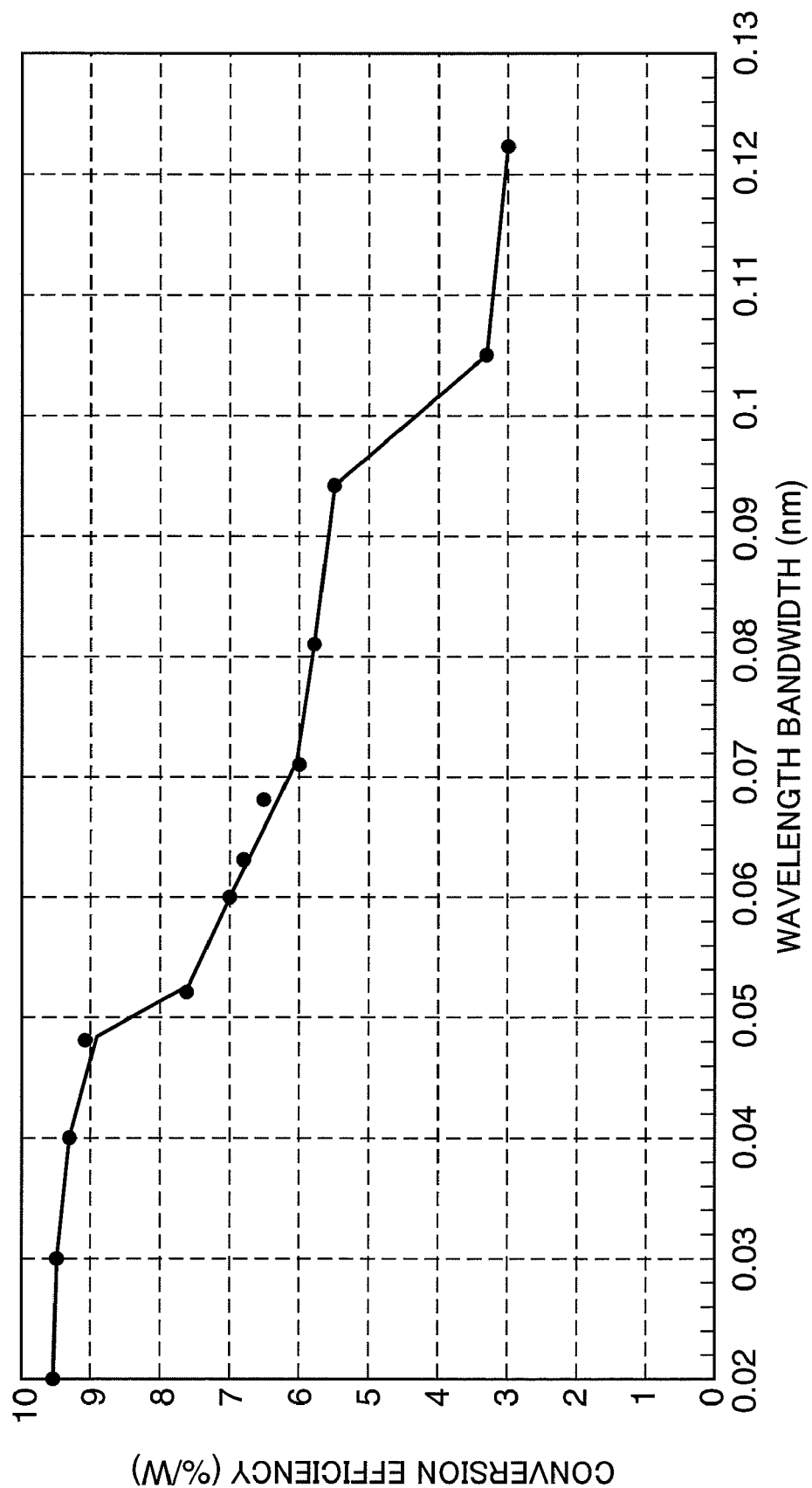
FIG. 2 is a graph showing a relationship between the wavelength bandwidth of a fiber grating and the wavelength conversion efficiency of a wavelength conversion element.

By reciprocation of the fundamental wave 23 between the reflection surfaces using the fiber grating 29 and the second reflection surface 33 as the pair of reflection surfaces of the laser resonator, the oscillation wavelength is mainly selected by the fiber grating 29 having a higher reflectance. The reflection wavelength and reflection wavelength bandwidth of the fiber grating 29 at this time are set to 1064 nm and 0.1 nm. Accordingly, the fundamental wave 23 is outputted from the fiber laser 22 with the wavelength bandwidth set at 0.1 nm. The reflectances of the fiber grating 29 of the fiber 26 and the second reflection surface 33 reflecting the fundamental wave 23 having a wavelength of 1064 nm are respectively set to 98% and 10%. The reflectance of 98% or higher in a narrow band having a wavelength bandwidth of 0.1 nm on the one reflection surface of the laser resonator can be realized because of the use of the fiber grating 29. By setting the reflectance of the fiber grating 29 to a value approximate to total reflection, a section where the generated fundamental wave is amplified in the fiber laser 22 can be extended. The wavelength bandwidth of the fiber grating 29 is preferably 0.1 nm or shorter, more preferably 0.05 nm or shorter. In this case, by narrowing the band of the fundamental wave outputted from the fiber laser 22, wavelength conversion efficiency in the wavelength conversion element 25 can be improved. FIG. 2 shows wavelength conversion efficiency in the wavelength conversion element 25 in relation to the wavelength bandwidth of the fiber grating 29. As shown in FIG. 2, the wavelength conversion efficiency in the wavelength conversion element 25 is understood to be improved by narrowing the wavelength bandwidth of the fiber grating 29, i.e. narrowing the wavelength bandwidth of the fundamental wave from the fiber laser 22.

Figure 3:
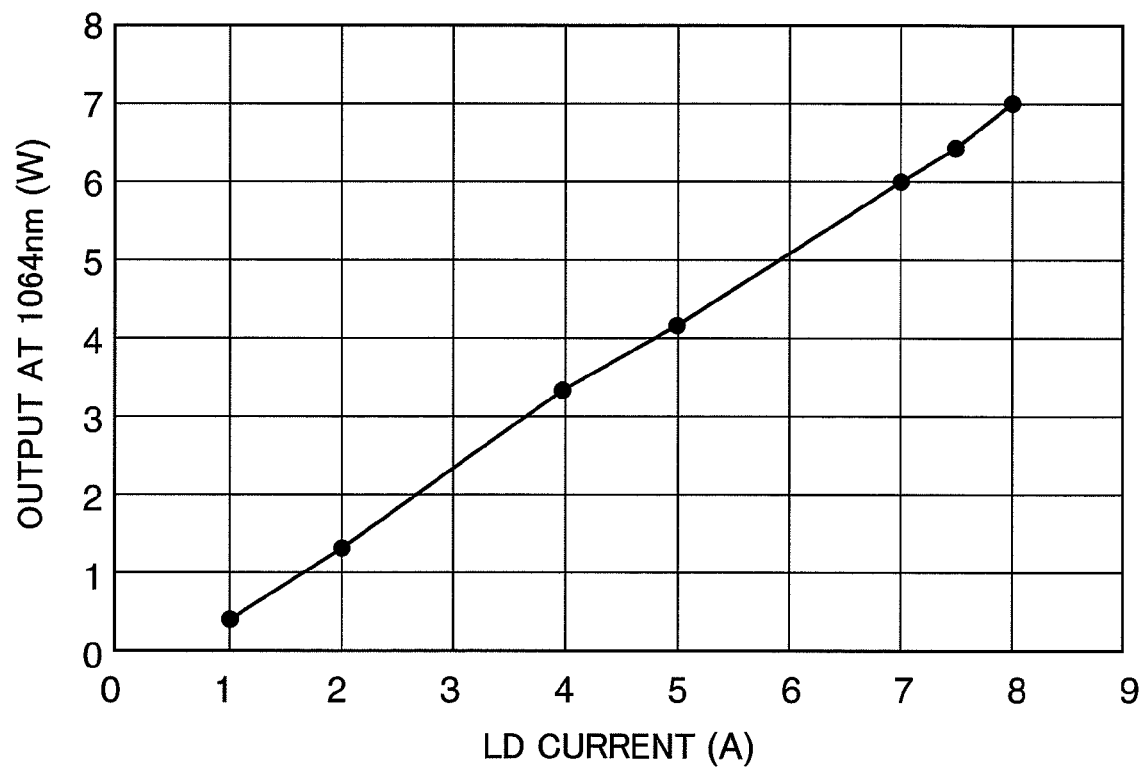
FIG. 3 is a graph showing an input/output characteristic of a light output of a fundamental wave in relation to an input current to an excitation laser light source.

A fundamental wave output of the fiber laser 22 can be increased by an input current of the excitation laser light source 28. FIG. 3 shows an input/output characteristic of a light output of a fundamental wave having a wavelength of 1064 nm in relation to the input current of the excitation laser light source 28. The fundamental wave output from the fiber laser 22 is understood to substantially linearly increase in proportion to the input current of the laser light source up to 7 W.

In order to obtain a high reflectance of the first reflection surface 34 for the excitation light 27 in this way, the multilayer film is formed on the end surface of the fiber 26. The multilayer film is made of, for example, dielectric materials and $SiO_2$, $TiO_2$, $Nb_2O_3$ and the like are often used. The multilayer film is formed on the end surface of the fiber 26 by a sputtering method or deposition method. For example, two materials are selected from these materials and laminated to form a film with a periodic multilayer structure having a thickness, which is ¼ of the wavelength of the excitation light 27, thereby forming the first reflection surface 34. As described above, the first reflection surface 34 is required to have a high reflectance for the excitation light 27 while being required to have a low reflectance for the fundamental wave 23. In other words, the reflectance of the first reflection surface 34 is required to satisfy the following relationships with the reflectance of the fiber grating 29. The reflectance of the first reflection surface 34 is smaller than that of the fiber grating 29 for the wavelength of the fundamental wave 23 while being larger than that of the fiber grating 29 for the excitation light 27.

Figure 4:
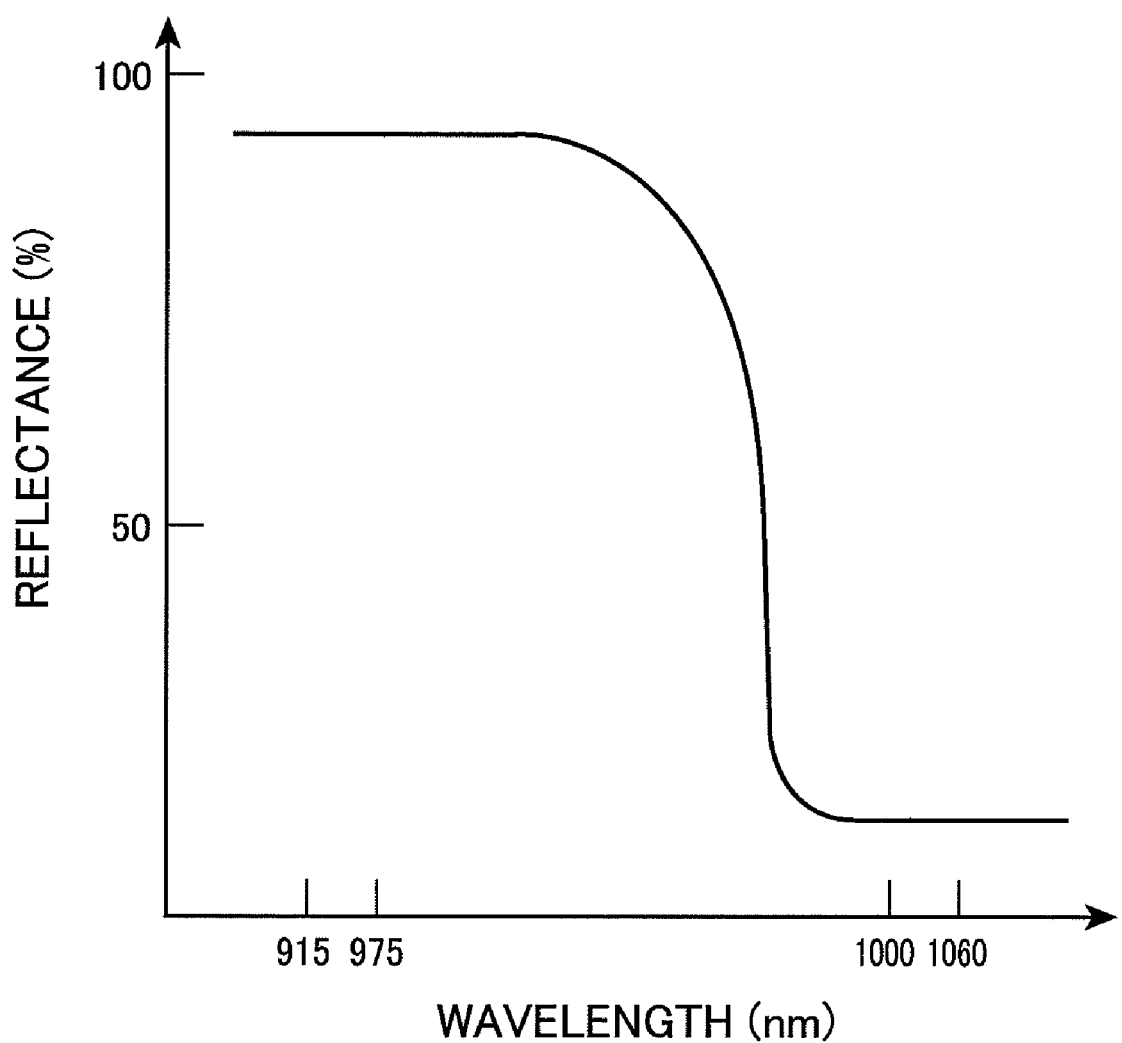
FIG. 4 is a graph showing an ideal characteristic of the reflectance of a first reflection surface.

By satisfying these relationships, it can be realized that the fundamental wave 23 resonates between the fiber grating 29 and the second reflection surface 33 and the excitation light 27 passes through the fiber grating 29 and is reflected by the first reflection surface 34. FIG. 4 shows an example of an ideal characteristic of the reflectance of the first reflection surface 34. As shown in FIG. 4, the reflectance of the first reflection surface 34 has a value approximate to total reflection at a wavelength 915 nm or 975 nm of the excitation light 27 of the laser light source 28 while having a low reflectance at a wavelength 1060 nm of the fundamental wave 23 of the fiber laser 22.

The reflectance of the second reflection surface 33 is set to 10% so that the fundamental wave 23 can be efficiently extracted as an incident light on the wavelength conversion element 25. The second reflection surface 33 of the fiber 26 may be formed by a polarizing mirror to facilitate an optical adjustment of a polarization direction to the wavelength conversion element 25 by stabilizing the polarization direction of the fundamental wave 23. This polarizing mirror can be realized by forming, for example, a thin film made of a dielectric multilayer thin film of $SiO_2/HfO_2$ on the end surface of the fiber 26 and embossing the outer surface of the $HfO_2$ thin film in stripes to reflect while selecting the polarizing direction. If the second reflection surface 33 is a polarizing mirror, the second reflection surface 33 is preferably designed to have a reflectance of about 10 to 15% for lights in a polarization direction desired to be oscillated and to have a transmittance of 99% or higher for lights in unnecessary polarization directions in order to construct a laser resonator with high efficiency and good polarization separation characteristic. Further, this polarizing mirror may have a wider reflection band of 50 to 100 nm as compared with the reflection band of the fiber grating 29. By setting the reflectance to 10 to 20%, an unnecessary loss of the excitation light 27 to be incident on the fiber 26 by a side band of a reflection spectrum can be reduced. The reflectance of the second reflection surface 33 is preferably 10 to 20%, more preferably 15% for the wavelength of the fundamental wave 23. In this case, the fundamental wave 23 from the fiber 26 can be efficiently extracted via the second reflection surface 33 while abnormal oscillation between the optical system 200 and the second reflection surface 33 is suppressed.

Next, a process of converting the emergent fundamental wave 23 into the harmonic output 24 by the wavelength conversion element 25 is described.

The fundamental wave 23 of 1064 nm outputted from the fiber laser 22 is incident on the wavelength conversion element 25 via the condenser lens 36. The wavelength conversion element 25 is an element for converting the incident light into a second harmonic and outputting it and, here, a crystal $MgO:LiNbO_3$ having a periodic poled structure and a length of 10 mm is used. Here, a wavelength at which the incident light is convertible into a harmonic in the wavelength conversion element 25 is called a phase-matching wavelength and is set at 1064 nm at 25° C. in this embodiment. Accordingly, the wavelength of the fundamental wave 23 from the fiber laser 22 coincides with the phase-matching wavelength, and the fundamental wave 23 is converted into a second harmonic in the wavelength conversion element 25 to become a green laser light having a half wavelength of 532 nm, and is outputted as the harmonic output 24 from the wavelength conversion element. Generally, the wavelength conversion element 25 is temperature-controlled with an accuracy of 0.01° C. since a phase-matching wavelength change is sensitive to the temperature of the element. The fiber grating 29 is temperature-controlled similarly to the wavelength conversion element 25 with an accuracy of 0.01° C. to prevent the grating pitch from being changed by a temperature increase when the fundamental wave 23 of W-class output or higher is reflected.

In this embodiment, the wavelength conversion element 25 and the fiber grating 29 are individually temperature-controlled with an accuracy of 0.01° C. by attaching Peltier elements 46, 47. By doing so, the harmonic output 24 of a W-class green laser can be obtained even if the fundamental wave output of the fiber laser 22 exceeds 5 W and heat generation in the wavelength conversion element 25 and the fiber grating 29 increases. Temperature sensors 48, 49 are attached to the Peltier elements 46, 47, and the Peltier elements 46, 47 and the temperature sensors 48, 49 are all connected with the output controller 40 to have the loading of temperature signal outputs and the driving of the respective parts and elements controlled.

However, if it is tried to obtain a W-class G-light from the wavelength converter, the wavelength of the fundamental wave of the fiber laser 22 and the phase-matching wavelength of the wavelength conversion element 25 need to coincide, and these wavelengths are difficult to coincide. In other words, the internal temperature of the wavelength conversion element 25 increases if the fundamental wave output incident on the wavelength conversion element 25 increases.

Figure 5:
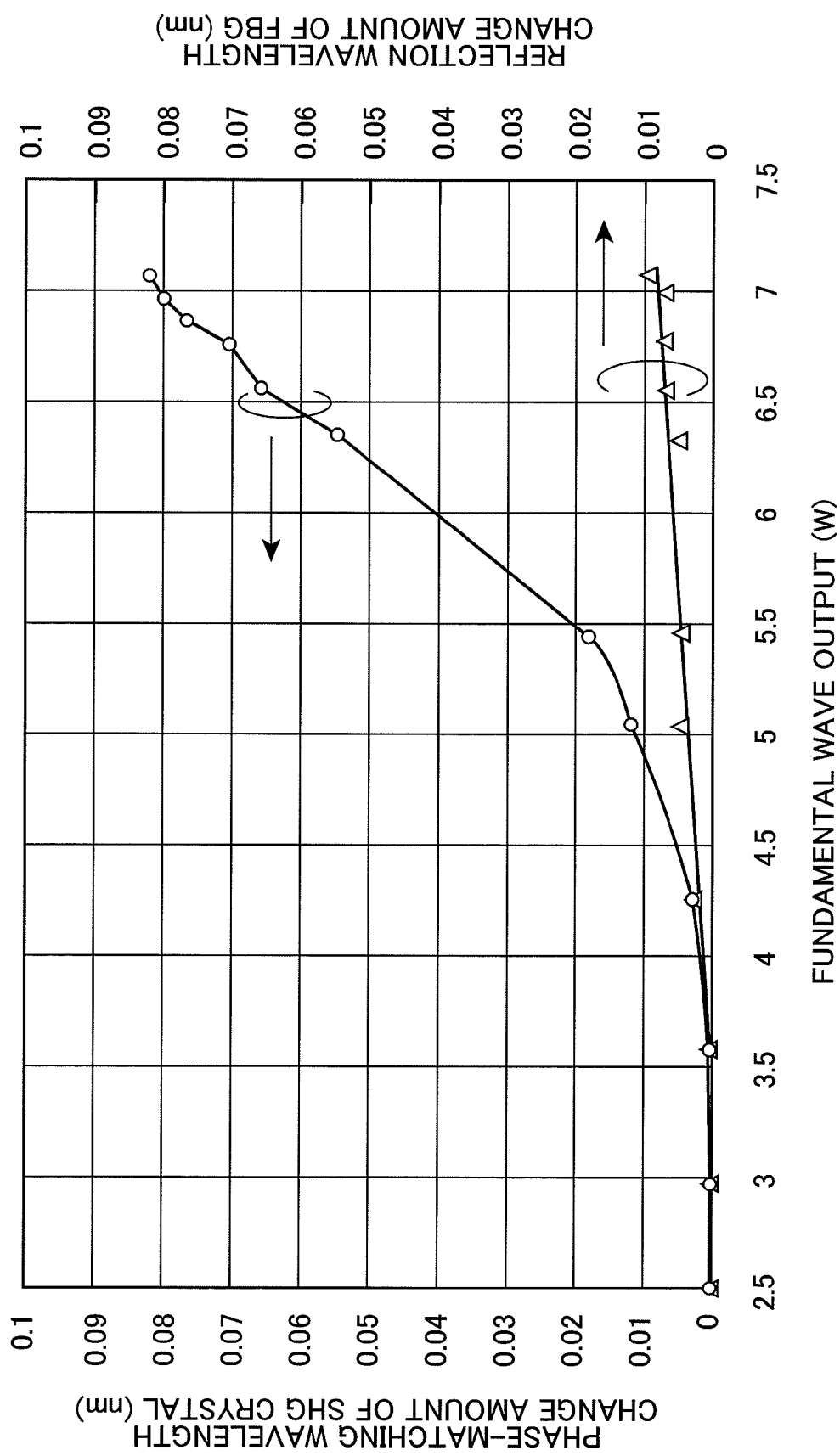

FIG. 5 shows a reflection wavelength change amount of the fiber grating 29 and a phase-matching wavelength change amount of the wavelength conversion element 25 in relation to the fundamental wave output 23 in the case of generating a second harmonic of 532 nm from a fundamental wave of 1064 nm. Generally, as shown in FIG. 5, wavelength change rates of the fiber grating and the wavelength conversion element in relation to the internal temperature are respectively 0.01 nm/K and 0.05 nm/K if the output of the fundamental wave 23 exceeds 2 to 3 W. Here, temperature increases when the fundamental wave output 23 increases by 1 W in the fiber grating 29 and the wavelength conversion element 25 are equivalent to about 1° C. For these reasons, a shift amount of the wavelength of the fundamental wave caused by the temperature increase and that of the phase-matching wavelength caused by the temperature increase largely deviate when the fundamental wave exceeds 5 W as compared with the case where the fundamental wave is a lower output of about 2 to 3 W. This relationship differs depending on the wavelength of the fundamental wave, i.e. the wavelength of the harmonic to be generated, and the internal temperature of the wavelength conversion element 25 tends to increase more as the wavelength of the harmonic is shortened.

In order to conform these two wavelength shift amounts by reducing a difference therebetween, the wavelength conversion element 25 having a larger wavelength shift amount by the temperature increase is air cooled by fanning after mounting a heat radiation fin, thereby suppressing the temperature increase. Further, in order to zero the difference between the two wavelength shift amounts, the output controller 40 regulates temperature with an accuracy of 0.01° C. using the Peltier elements 46, 47 to maximize the harmonic output 24. If this temperature regulation is described for an exemplary case where the temperature of the wavelength conversion element 25 has increased, the phase-matching wavelength of the wavelength conversion element 25 shifts toward a long wavelength side and the output of the G-light from the wavelength conversion element 25 decreases. Accordingly, the output controller 40 increases the temperature of the fiber grating 29 to shift the wavelength of the fundamental wave toward the long wavelength side while suppressing the temperature increase of the wavelength conversion element 25 as described above. In this way, the shift amount of the phase-matching wavelength of the wavelength conversion element 25 and the shift amount of the wavelength of the fundamental wave are conformed to recover from an output reduction of the G-light from the wavelength conversion element 25.

By finely regulating the temperatures of the wavelength conversion element 25 and the fiber grating 29 in this way, the shift amount of the wavelength of the fundamental wave and shift amount of the phase-matching wavelength of the wavelength conversion element 25 are conformed to stably obtain a high-output G-light of several W or higher.

Figure 6A:
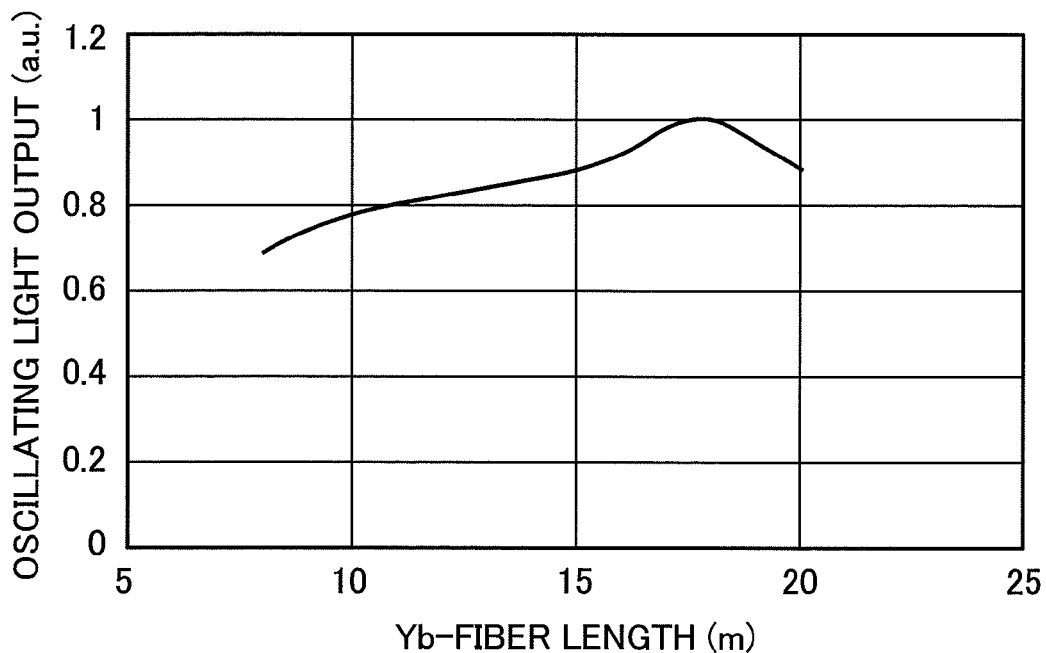
FIG. 6A shows the dependency in a conventional fiber laser and FIG. 6B shows the dependency in a fiber laser of the first embodiment.
Figure 6B:
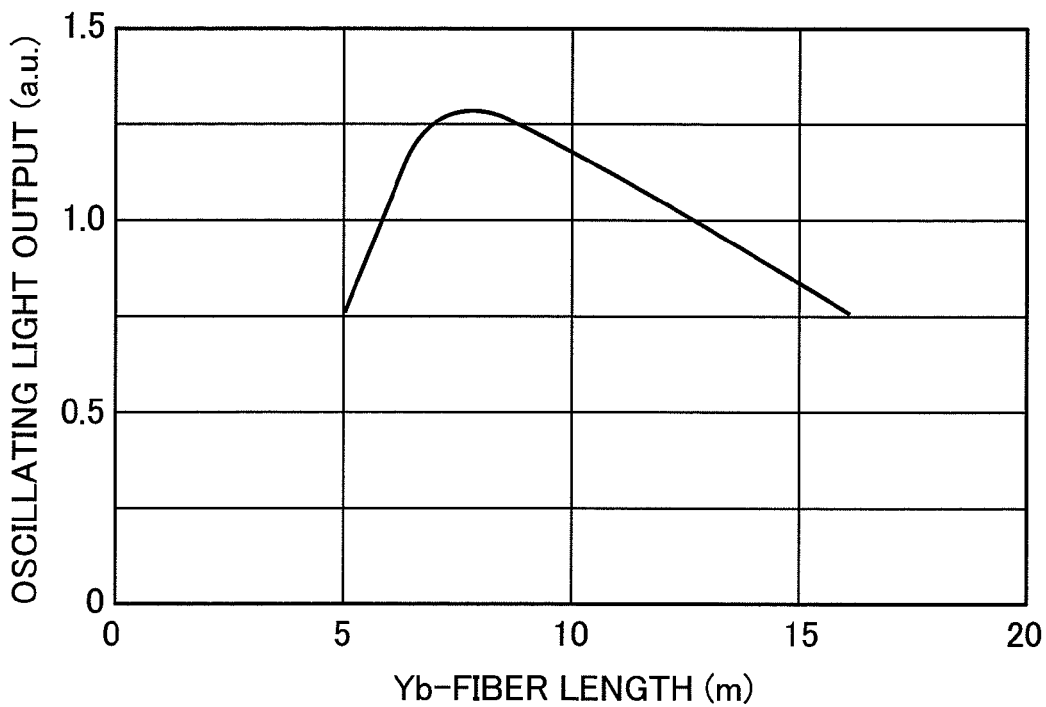

In the fiber laser 22 of this embodiment, the length of the fiber 26 is about half the conventional length. FIGS. 6A and 6B show an oscillating light output of a fundamental wave in relation to the fiber length when two types of fibers having core parts doped with a rare earth element Yb as a laser active material at a concentration of 1200 ppm are used. FIG. 6A shows a case where an excitation light is absorbed by the fiber used as in the conventional art shown in FIG. 16, wherein the excitation light is incident on one end of the fiber and the excess excitation light is outputted from the other end. On the other hand, in this embodiment shown in FIG. 1, the oscillation output of the fundamental wave light increases by about 10% if the excitation light is reflected at the end surface of the fiber to be completely absorbed by the fiber. FIG. 6B shows the case of this embodiment shown in FIG. 1 where the excitation light 27 is reflected by the first reflection surface 34 and is completely absorbed while making a round trip in the fiber 26. In FIGS. 6A and 6B, a laser having a wavelength of 915 nm was used as the excitation laser light source 28, the excitation light 27 having a light output of 9 W was injected through the end surface of the fiber, the fiber length was changed in the case of generating a fundamental wave of 1064 nm to measure the light output of the fundamental wave of 1064 nm.

As shown in FIGS. 6A and 6B, there is an optimal fiber length to maximize the light output of the fundamental wave in either case. If the fiber length is shorter than the optimal length, the light output of the fundamental wave decreases as the fiber length becomes shorter and the laser oscillation stops because there is little excitation light absorbed in the resonator of the fiber laser and the amplifying section of the oscillating light is short. Conversely, if the fiber length is longer than the optimal length, the light output of the fundamental wave decreases as the fiber length becomes longer and, consequently, the laser oscillation stops because the absorption of the fundamental wave in the resonator of the fiber laser increases to increase a loss in the resonator. This measurement result is an example of the experimental result of the present invention. It can be understood from FIG. 6A that the optimal fiber length in the conventional construction is 17 m and from FIG. 6B that the optical fiber length in this embodiment is 7.5 m. From this as well, it can be understood that the fiber length in this embodiment may be equal to or shorter than half the fiber length in the conventional construction.

The oscillating light outputs in the vertical axes of FIGS. 6A, 6B are in arbitrary units (a.u.), but the reference light output is the same. It can be understood that the light output at the optimal fiber length in this embodiment is larger by about 20% than the light output at the optimal fiber length in the conventional construction. It can be inferred from this that the oscillating light is efficiently amplified while making a round trip in the fiber to increase the gain for the fundamental wave. "Light-light conversion efficiency" calculated by dividing the intensity of the oscillating light by the inputted excitation light intensity was 41.3% in the conventional construction of FIG. 16. On the other hand, in the reflecting construction proposed in this embodiment, it was improved to 50.2% by reflecting the fundamental wave by the fiber grating 29 at such a reflectance approximate to total reflection and efficiently amplifying it with a low loss in the short fiber, and further improved to 54.7% by providing the first reflection surface 34 for reflecting the excitation light and increasing the gain in the section where the fundamental wave is amplified.

Figure 7:
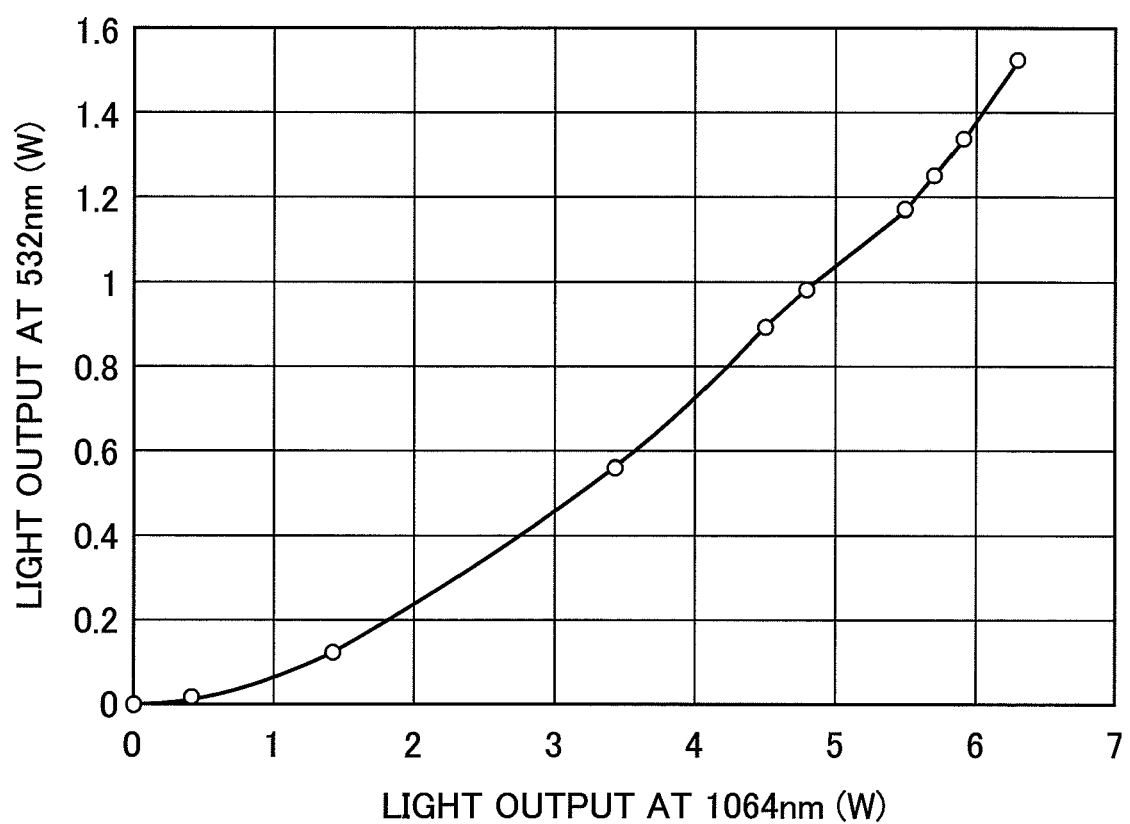
FIG. 7 is a graph showing an input/output characteristic of a high frequency output light in relation to an input light of the fundamental wave.

When the wavelength converter 21 using the fiber of FIG. 6B was operated, a G-light of 1.5 W was stably obtained when the fiber was excited by the excitation light having a light output of 9 W and the fundamental wave output was 6.3 W. The conversion efficiency of the G-light is thought to be largely improved if the fundamental wave output is further increased. FIG. 7 shows an input/output characteristic of a harmonic output of 532 nm in relation to a fundamental wave of 1064 nm as an input light. The output light can be understood to increase in proportion to the square of the input light.

By the construction described above, the fiber laser of this embodiment can substantially entirely absorb the excitation light with half the fiber length of the conventional construction and the amplifying section for the fundamental wave is extended. Thus, a uniformly high gain can be obtained to amplify the fundamental wave. Since the fiber length can be halved, it is possible to make the fiber laser smaller, to obtain a high-output fundamental wave and to miniaturize the wavelength conversion element.

Further, the fiber laser of this embodiment can be formed by the fiber having half the length of the conventional one. Accordingly, the absorption of the fundamental wave by the fiber laser is halved and the absorption at a short wavelength side where the absorption is large is also halved. Thus, a high-output laser light of the fundamental wave of 1030 nm shorter than 1064 nm can be, for example, obtained.

Figure 8A:
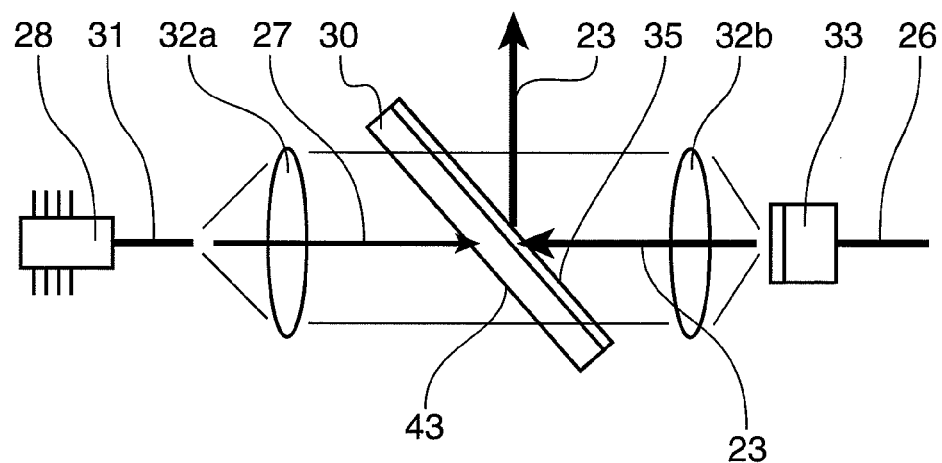
FIG. 8A is an enlarged view of an optical system for coupling an excitation laser light source and a fiber of the wavelength converter according to the first embodiment of the invention and FIG. 8B is an enlarged view of an extraction mirror in the optical system of FIG. 8A.

Next, the optical system for coupling the excitation laser light source 28 and the fiber 26 of the fiber laser 22 of FIG. 1 is described in detail. FIG. 8A is an enlarged view of the optical system of FIG. 1 and FIG. 8B is an enlarged view of the extraction mirror 30 of FIG. 1.

In FIG. 8A, an excitation light 27 emitted from the excitation laser light source 28 via the belonging fiber 31 passes through the extraction mirror 30 after being converted into a parallel light by the collimator lens 32a. The excitation light 27 substantially entirely passes through the extraction mirror 30 and is incident on the fiber 26 via the condenser lens 32b. The incident excitation light 27 is entirely absorbed while making a round trip in the fiber 26. The fiber 26 having a uniformly high gain for the fundamental wave by absorbing the excitation light 27 amplifies the fundamental wave and outputs a fundamental wave 23 from the second reflection surface 33. The fundamental wave 23 is substantially totally reflected by the multilayer film 35 formed on the surface of the extraction mirror 30 to be incident on the wavelength conversion element 25.

Figure 8B:
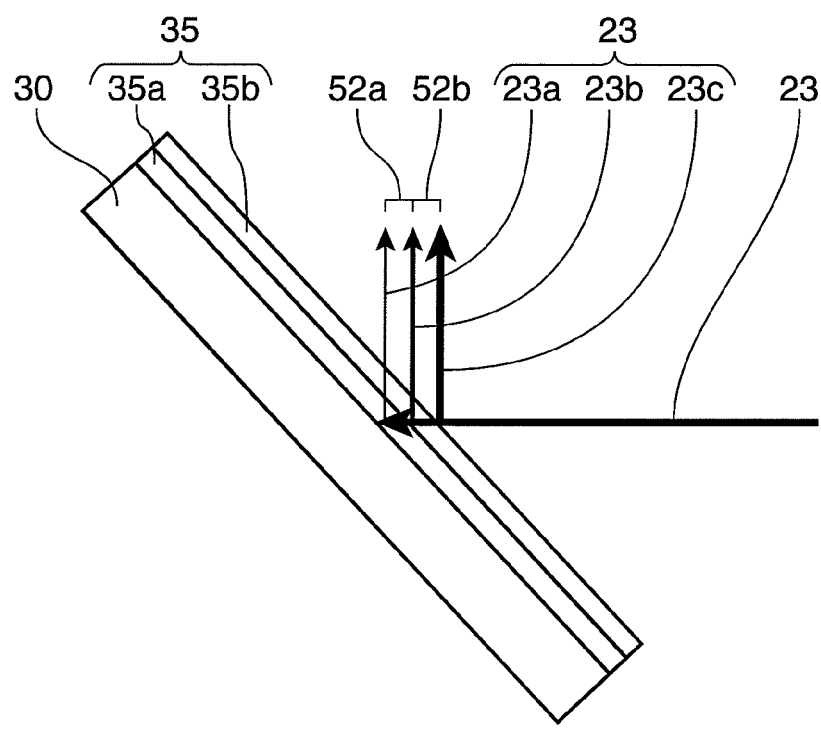

FIG. 8B is the enlarged view of the extraction mirror 30. The fundamental wave 23 is incident on the extraction mirror 30 and reflected by the multilayer film 35 on the surface of the extraction mirror 30. This multilayer film 35 is made up of dielectric thin films 35a, 35b of, e.g. $SiO_2$, $TiO_2$ and $Nb_2O_3$ little absorbing the fundamental wave 23. Since distances 52a, 52b the fundamental wave 23 travels in the multilayer film 35 are designed such that the phases of components 23a, 23b and 23c of the reflected fundamental wave 23 are aligned, the multilayer film 35 exhibits a high reflectance for the fundamental wave 23. In the case of arranging the extraction mirror 30 at 45° to the fundamental wave 23, the distances 52a, 52b correspond to half the wavelength of the fundamental wave 23. On the other hand, as shown in FIG. 8A, the extraction mirror 30 is designed to exhibit a high transmittance for the excitation light 27. Specifically, by forming the multilayer film 35 with wavelength selectivity on the surface of the extraction mirror 30 utilizing a wavelength difference between the wavelength 915 nm of the excitation light 27 and the wavelength 1064 nm of the fundamental wave 23, the transmittance for the excitation light 27 and the reflectance for the fundamental wave 23 are increased to improve the efficiency of the entire wavelength converter. Further, since the fundamental wave 23 is substantially totally reflected by the extraction mirror 30, it hardly reaches the excitation laser light source 28. Thus, the extraction mirror 30 also prevents the damage of the laser light source 28 and the like by the multilayer film 35 as a wavelength selecting portion.

Figure 9A:
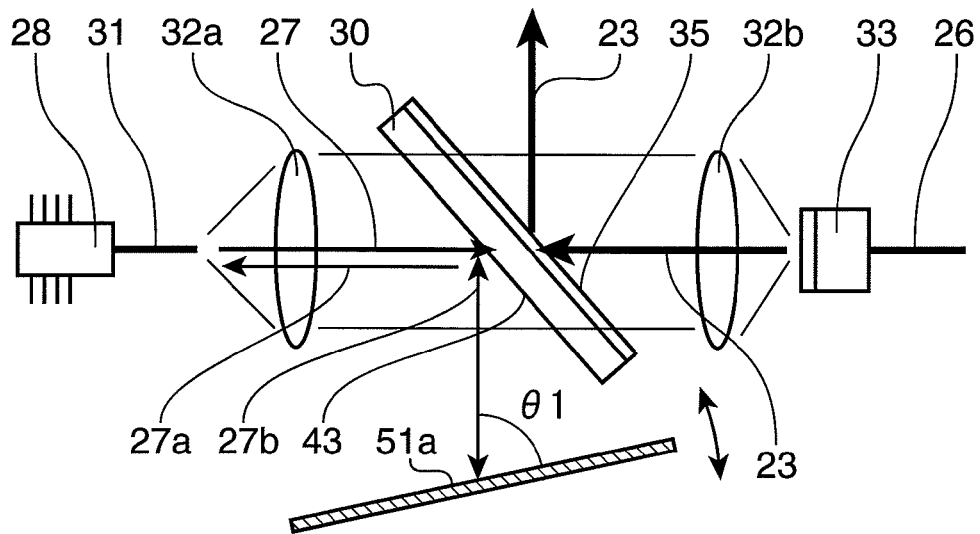
FIG. 9A is an enlarged view of an optical system for selecting the wavelength of an excitation light of the wavelength converter by a reflective diffraction grating and FIG. 9B is an enlarged view showing an optical system for selecting the wavelength of the excitation light by a transmissive diffraction grating in the first embodiment of the invention.
Figure 9B:
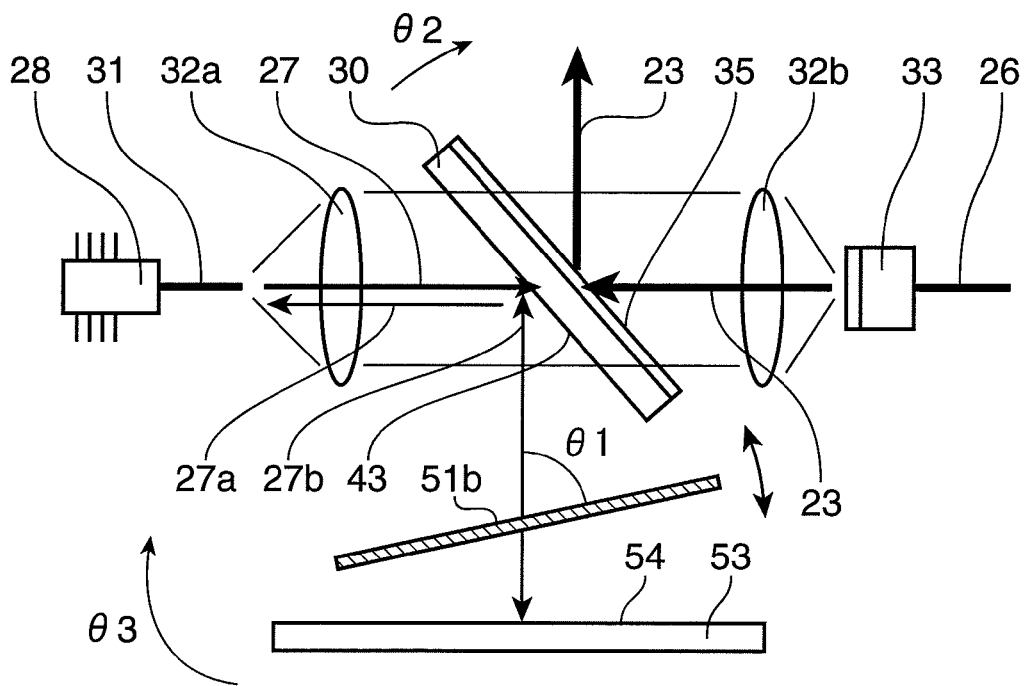

Exemplary constructions for stabilizing the oscillation wavelength of the excitation laser light source 28 of FIG. 1 are shown in FIGS. 9A and 9B. FIG. 9A shows an example utilizing a reflection diffraction grating and FIG. 9B shows an example utilizing a transmission diffraction grating.

As shown in FIG. 9A, the oscillation wavelength of the excitation laser light source 28 can be stabilized by adding a reflection diffraction grating 51a to the optical system of FIG. 8A. A small part 27b of the excitation light 27 reflected by the extraction mirror 30 is returned as an excitation light 27a along the same path after having the wavelength selected with high accuracy by the diffraction grating 51a shown in FIG. 9A, thereby being injected into the laser light source 28. By doing so, the wavelength selected with high accuracy in the diffraction grating 51a is amplified in the laser light source 28 and the wavelength of the excitation light 27 emitted from the laser light source is fixed to the selected wavelength. In addition, as described in the case of forming the extraction mirror 30 by the transmission filter, the diffraction grating 51a not only selects a center wavelength, but also functions as a narrow band filter. As shown in FIG. 9A, this wavelength selection of the excitation light 27 can be realized by arranging the diffraction grating 51a and rotationally adjusting an angle θ1 to the excitation light 27b.

FIG. 9B shows an example for stabilizing the oscillation wavelength of the excitation laser light source 28 by using a transmission diffraction grating 51b and a reflection mirror 53 instead of the reflection diffraction grating 51a of FIG. 9A. A small part 27b of the excitation light 27 reflected by the extraction mirror 30 is reflected by a reflection surface 54 of the reflection mirror 53 after passing through the diffraction grating 51b shown in FIG. 9B while having the wavelength selected with high accuracy. The reflected excitation light 27b is returned as an excitation light 27a along the same path to be injected into the laser light source 28. By doing so, the wavelength selected with high accuracy in the diffraction grating 51b is amplified in the laser light source 28 and the wavelength of the excitation light 27 emitted from the laser light source is fixed to the selected wavelength. In addition, as described in the case of forming the extraction mirror 30 by the transmission filter, the diffraction grating 51b not only selects a center wavelength, but also functions as a narrow band filter.

Since the diffraction grating 51b is of the transmission type in the construction of FIG. 9B, the selection range of the center wavelength is wider as compared with the construction of FIG. 9A. Further, the selection and control of an emission direction of the fundamental wave 23 through the rotation of the extraction mirror 30 and the selection of the wavelength of the excitation light 27 can be independently performed. Specifically, if the emission direction of the fundamental wave 23 is selected by rotating the extraction mirror 30 only by θ2 in FIG. 9B, this is followed by the integral rotation of the diffraction grating 51b and the reflection mirror 53 only by θ3.

However, the wavelength of the excitation light 27 is selected by selecting the angle θ1 of the diffraction grating 51 to the excitation light 27 separately from the above angular rotations of θ2 and θ3.

If the construction of FIG. 9A or 9B is utilized in this way, a wavelength at which the absorption by the fiber is larger can be used as the wavelength of the laser light source 28 of FIG. 1, for example, in an absorption spectrum of the Yb-doped fiber used as the fiber laser in this embodiment. In other words, an excitation light having a wavelength of 976 nm at which the absorption is three or more times as large as the absorption at the wavelength of 915 nm used in this embodiment can be utilized. The absorption spectrum at this wavelength of 976 nm has a narrower wavelength band than that at the wavelength of 915 nm, but can be sufficiently utilized by selecting the wavelength with high accuracy using the diffraction grating 51a, 51b shown in FIG. 9A or 9B to fix the oscillation wavelength of the excitation light 27 in the laser light source 28. When the wavelength of the excitation light 27 was set to 976 nm in the wavelength converter 21 having the construction of FIG. 1, it was confirmed that the output of a G-light, which was 1.5 W with the excitation light of 9 W and 915 nm, became 2.5 W and that the G-light as the harmonic output 24 could obtained with higher efficiency.

Figure 15:
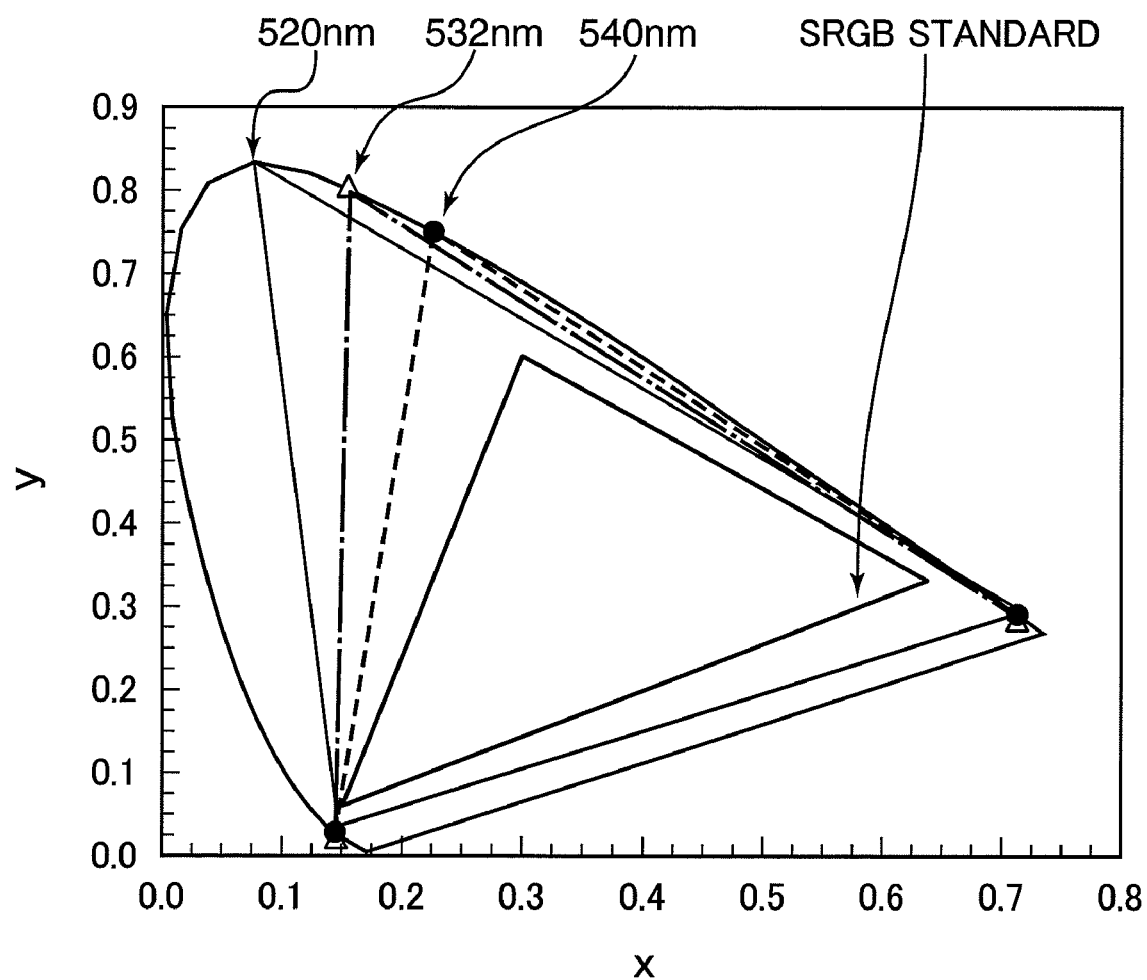
FIG. 15 is a chromaticity diagram showing color reproduction ranges of SRGB standards and the two-dimensional image display device according to the fifth embodiment of the invention.

As is clear from the optimal fiber length in relation to the oscillation wavelength of the fiber laser 22 shown in FIG. 15, the absorption of the fundamental wave 23 increases as the oscillation wavelength of the fundamental wave 23 in the fiber laser 22 becomes shorter. Thus, it can be understood that the optimal fiber length also becomes shorter. Thus, the section where the fundamental wave seed light is amplified becomes shorter, wherefore it has been difficult to obtain a high-output fundamental wave. However, in this embodiment, the optimal fiber length is shortened to suppress the loss of the fundamental wave by reflecting the excitation light, whereby the output of the fundamental wave is increased. Accordingly, a W-class high-output G-light can be obtained with the fiber length shorter than the conventional one, wherefore the construction of this embodiment is suitable for generating a G-light having a shorter wavelength than conventional G-lights.

Accordingly, this embodiment enables a fundamental wave having a shorter wavelength than the fundamental wave used in this embodiment to be obtained at a high output of 5 W or higher by regulating the kind and amount of the rare earth element to be doped in the fiber and by shortening the reflection wavelength of the fiber grating. Therefore, a W-class green laser light having a shorter wavelength of 510 to 540 nm can be obtained by a similar construction.

Since a green laser light having a shorter wavelength of 510 to 540 nm can be obtained and a color reproduction range can be extended than that of the conventional SRGB standards, the color reproduction range is further extended upon application to a display or the like.

In this embodiment, the fundamental wave 23 is extracted from the fiber laser 22 by providing the extraction mirror 30 in the optical system 200 of FIG. 1 to cause the excitation light from the excitation laser light source 28 to directly propagate straight and to be incident on the fiber 26 while emitting the fundamental wave 23 from the fiber 26 in a direction substantially perpendicular to an optical path between the laser light source 28 and the fiber 26. However, the present invention is not limited to this construction of the optical system 200. In other words, an optical system of any construction may be used provided that the emission direction of the fundamental wave 23 can be so changed as to avoid the coincidence of an extraction direction of the fundamental wave 23 from the fiber 26 with the optical path between the laser light source 28 and the fiber 26 and to enable the emission of the fundamental wave 23 to the wavelength conversion element 25 without returning the fundamental wave 23 to the laser light source 28.

Second Embodiment

Figure 10:
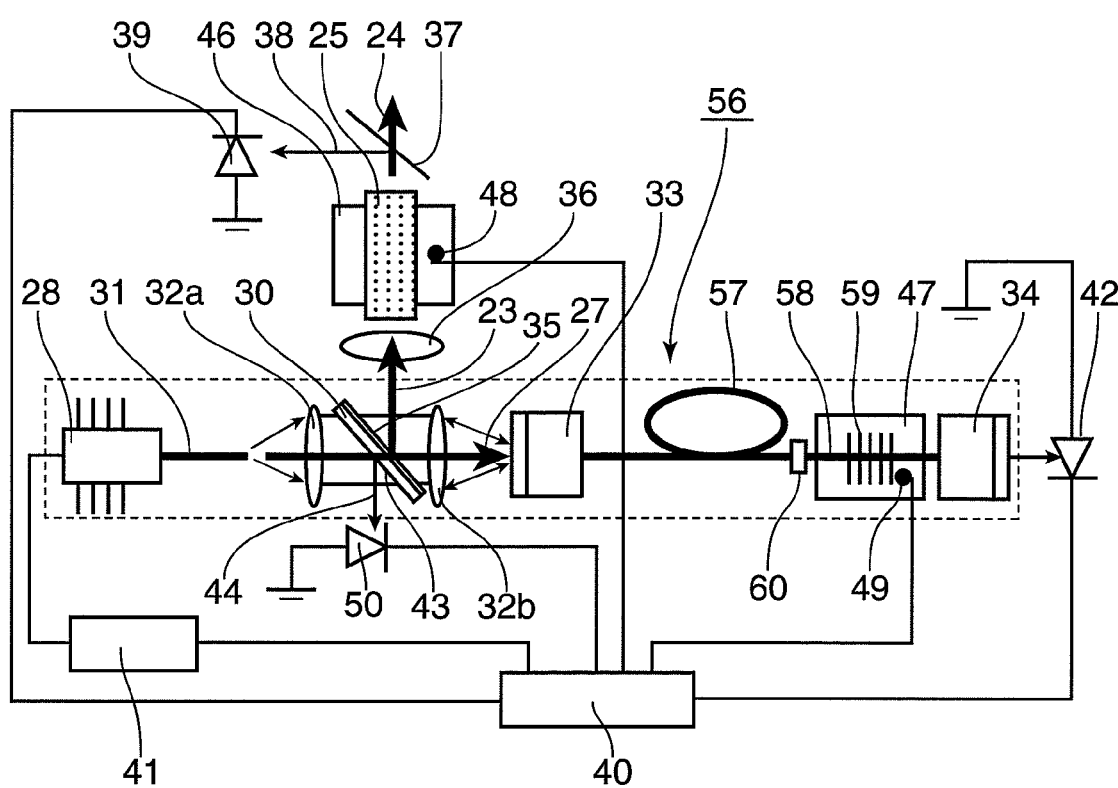
FIG. 10 is a schematic diagram showing the construction of a wavelength converter according to a second embodiment of the invention.

FIG. 10 shows the construction of a wavelength converter according to a second embodiment of the present invention. Similar to the first embodiment, a wavelength converter 55 of this embodiment is basically provided with a fiber laser 56, a wavelength conversion element 25 for converting a fundamental wave 23 emitted from the fiber laser 56 into a harmonic output 24 and a condenser lens 36 arranged between the fiber laser 56 and the wavelength conversion element 25. This embodiment differs from the above first embodiment in that the fiber laser 56 is not made of one fiber, but such that a first fiber 57 containing a laser active material and a second fiber 58 having a fiber grating 59 formed therein are connected by a connecting portion 60.

By adopting such a construction, the first fiber 57 can be formed to be doped with an optimal amount of an optimal laser active material so that an excitation light 27 can be efficiently absorbed. Further, a fiber easily formed with the fiber grating 59 and a first reflection surface 34 can be selected as the second fiber 58.

Here, a double-clad polarization maintaining fiber is used as the first fiber 57 and a rare earth element Yb is doped as a laser active material into a core part at a concentration of 1320 ppm to increase the absorption of the excitation light 27 per unit length, whereby the fiber length is made shorter by about 10% as compared with the construction of FIG. 1. By maintaining the total gain for amplifying the fundamental wave 23 and shortening the fiber length, the absorption of the fundamental wave 23 by the fiber laser 56 is reduced to be able to output a fundamental wave 23 having a shorter wavelength.

On the other hand, a fiber doped with no rare earth element is used as the second fiber 58 to reduce the absorption of the excitation light 27 in the second fiber 58, thereby increasing conversion efficiency of the entire fiber laser 56 from the excitation light 27 into the fundamental wave 23. The material and structure of this fiber are suitable to accurately set the reflection wavelength and the wavelength bandwidth of the fiber grating 59. Using the fiber laser 56 constructed as above, a W-class G-light was obtained from the wavelength converter 55 similar to the first embodiment.

Figure 16:
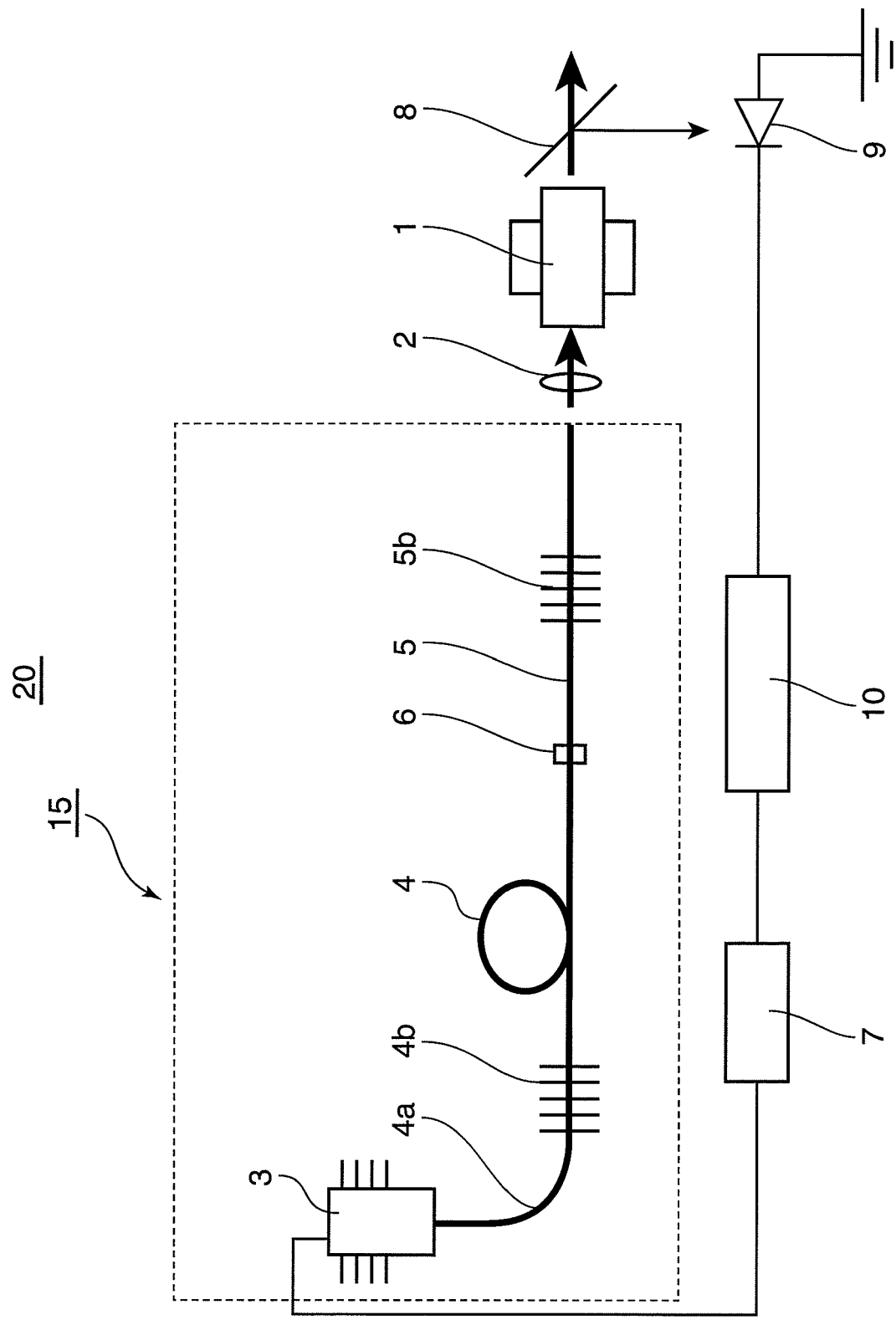
FIG. 16 is a schematic diagram showing the construction of a conventional wavelength converter.
Figure 17:
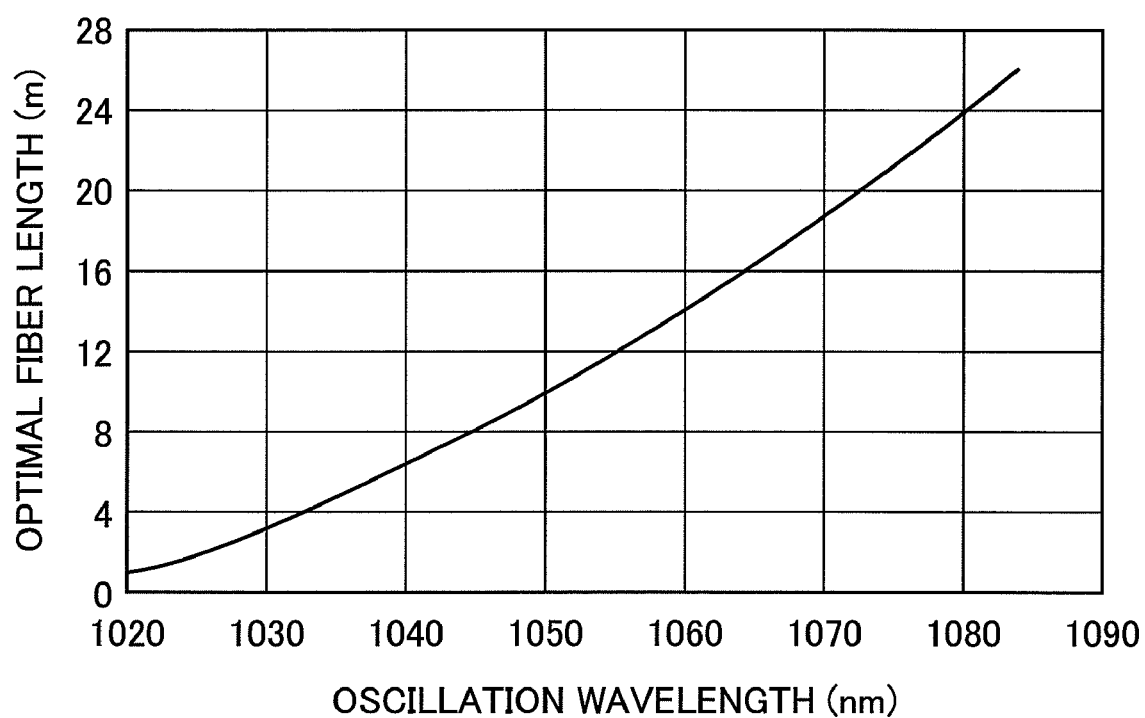
FIG. 17 is a graph showing an optimal fiber length in relation to the oscillation wavelength of a conventional fiber laser in the conventional wavelength converter.

Since the first and second fibers 57, 58 are double-clad fibers in this embodiment, fiber deterioration caused in a connected part of a double-clad fiber and a single-mode fiber as shown in the prior art of FIG. 16 can be prevented and the reliabilities of the fiber laser and the wavelength converter can be improved.

Further, since the fiber is divided into a plurality of parts and each part is so made of an optimal material to have an optimal structure, the fiber length can be shortened. Accordingly, a green laser light having a short wavelength of 510 to 540 nm can be obtained and the color reproduction range can be more extended than that of the conventional SRGB standards by shortening the fiber length of the fiber laser, wherefore the color reproduction range can be further extended upon application to a display or the like.

Third Embodiment

Figure 11:
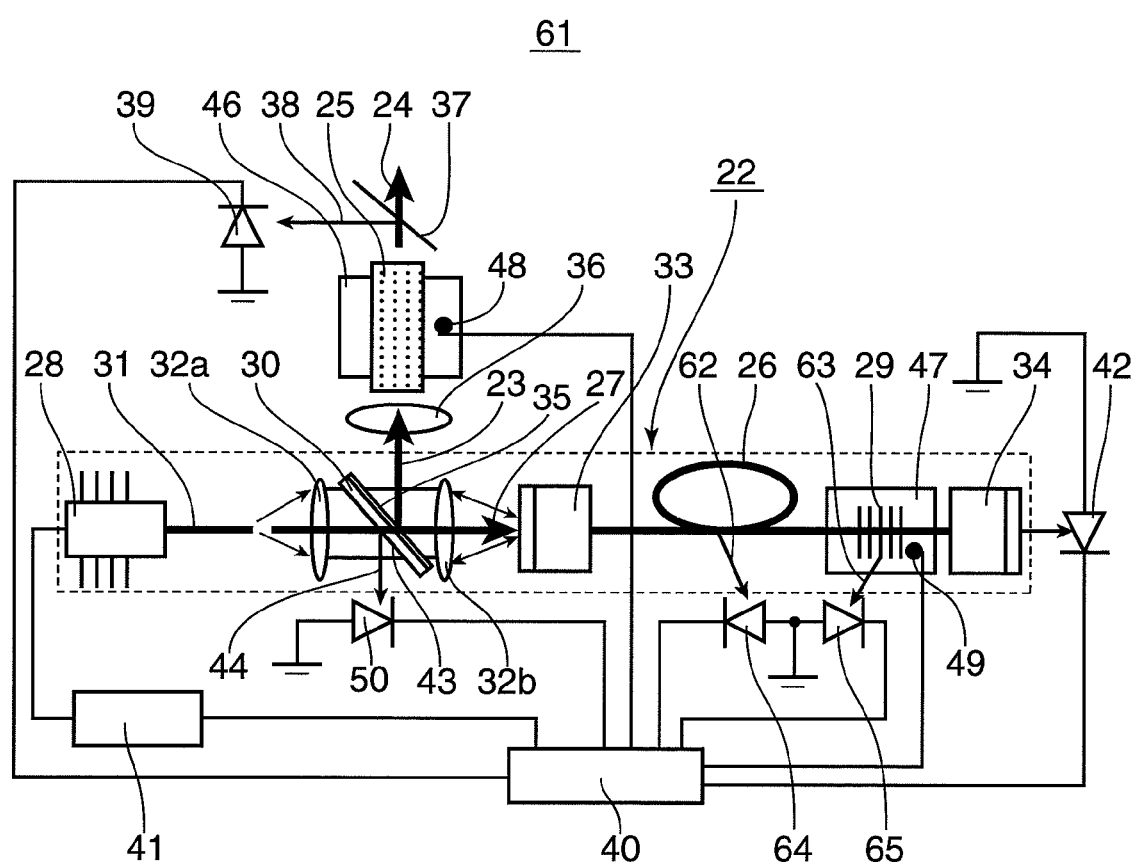

FIG. 11 shows the construction of a wavelength converter according to a third embodiment of the present invention. In this embodiment, a wavelength converter 61 of FIG. 11 is overall so constructed as to be able to control a laser output after wavelength conversion based on data inputted beforehand. The construction of this embodiment is similar to that of the first embodiment shown in FIG. 1 except that many light receiving elements for detecting the light quantities of an excitation light 27, a fundamental wave 23 and a harmonic output 24 are arranged and connected to an output controller 40.

In the wavelength converter 61 of FIG. 11, the harmonic output 24 is detected by having a part 38 thereof detected by a light receiving element 39. The fundamental wave 23 is detected by having any of a light leaking from a first reflection surface 34 of a fiber laser 22, a part 62 of the fundamental wave leaking from a processed part of the fiber 26 and a part 63 of the fundamental wave scattered by a fiber grating 29 detected by any one of light receiving elements 42, 64 and 65. The excitation light 27 is detected by having a light slightly reflected by an extraction mirror 30 detected by a light receiving element 50 or having a light slightly transmitting the first reflection surface 34 detected by the light receiving element 42. All of these light receiving elements 39, 42, 50, 64 and 65 are connected to the output controller 40. Peltier elements 46, 47 and temperature sensors 48, 49 arranged for controlling the temperatures of a wavelength conversion element 25 and the fiber grating 29 are also connected to the output controller 40. The output controller 40 figures out the overall status of the wavelength converter 61 by signals from the respective light receiving elements 39, 42, 50, 64 and 65 and temperature controlling/detecting elements, and stably outputs a desired harmonic output 24 by controlling these elements and a laser current source 41. For example, the output controller 40 operates as an output control unit to minimize a current value of an excitation laser light source 28 as an input and to maximize the harmonic output 24 as an output based on detection signals from the respective light receiving elements 39, 42, 50, 64 and 65 and table data inputted beforehand.

Typical data inputted and stored as a table beforehand are data on the phase-matching wavelength change amount in the wavelength conversion element 25 and the reflection wavelength change amount in the fiber grating 29 in relation to the fundamental wave output 23 shown in FIG. 5. Since the temperature dependencies of these wavelength change amounts in the wavelength conversion element 25 and the fiber grating 29 are respectively 0.05 nm/K and 0.01 nm/K, the respective temperature increases are estimated from these numeral values. The phase-matching wavelength of the wavelength conversion element 25 and the wavelength of the fundamental wave 23 are precisely conformed to each other based on these data to maximize conversion efficiency from the fundamental wave 23 into the harmonic output 24. To this end, a heat radiation fin is attached to the wavelength conversion element 25 to maximally suppress a temperature increase by fanning and is cooled by the Peltier element 46 to suppress a temperature increase, so that the temperature of the wavelength conversion element 25 is controlled to be constantly, for example, a room temperature of about 25° C. On the other hand, since the wavelength of the fundamental wave 23 is determined by the reflection wavelength of the fiber length grating 29, the fiber grating 29 is heated or cooled by the Peltier element 47 to change the grating pitch, thereby changing the reflection wavelength. In this way, the reflection wavelength is adjusted to the phase-matching wavelength of the wavelength conversion element 25 at that time. Since physical amounts for increasing the output efficiency of the wavelength converter 61 are controlled by the output controller, if an infrared light of 1064 nm is used as a fundamental wave, the output of the fundamental wave 23 is efficiently converted into the second harmonic in the wavelength conversion element 25 to obtain a W-class G-light of 532 nm.

Fourth Embodiment

Figure 12A:
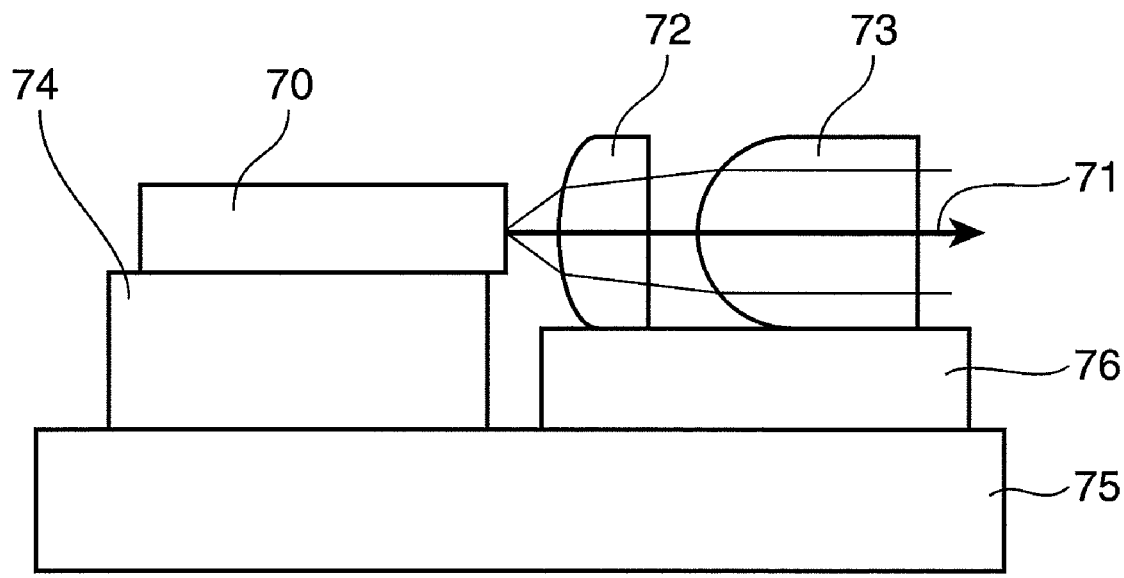
FIG. 12A shows a construction in the case of beam shaping by a cylindrical lens and FIG. 12B shows a construction in the case of beam shaping by a lens fiber.
Figure 12B:
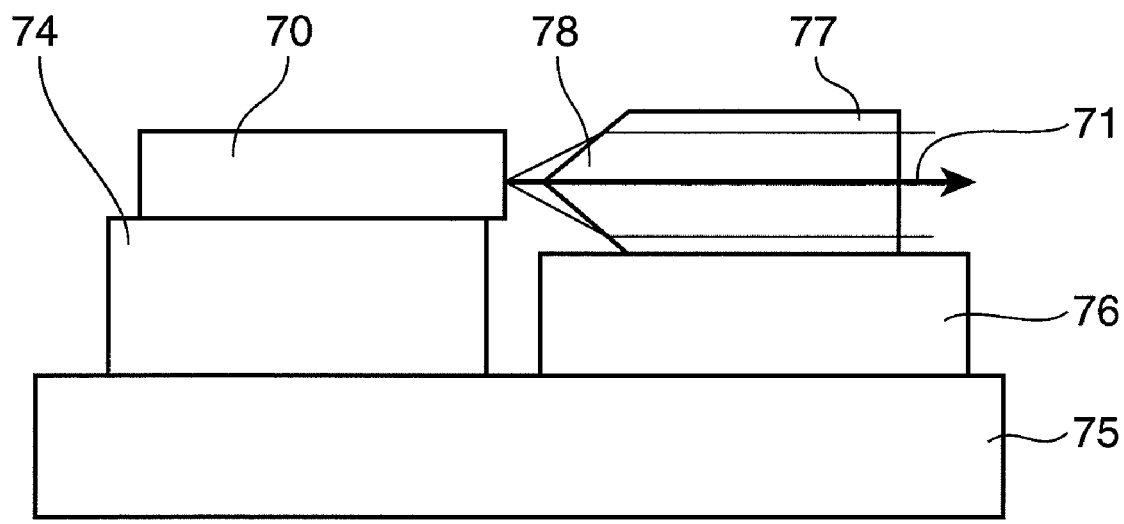

FIGS. 12A and 12B show constructions of excitation laser light sources usable in a wavelength converter according to a fourth embodiment of the present invention. In the first to third embodiments, the excitation laser light source used is of the general pigtail type including the fiber for guiding the excitation light to the outside. The use of such a laser light source makes it difficult to miniaturize an optical system for coupling the laser light source and a fiber laser. For the miniaturization of such an optical system, it is necessary to arrange the optical system very close to an excitation laser chip.

FIGS. 12A and 12B show miniaturized optical systems in which a small-size optical component is arranged very close to an excitation laser chip 70 to couple the laser chip 70 to a fiber laser by converting an excitation light 71 into a parallel light whose beam diameter is several tens μm. A divergent angle of the excitation light 71 emitted from the excitation laser chip 70 depends on a laser structure. Since the laser chip 70 is a waveguide semiconductor laser, the divergent angle has a value of about ±10° to a horizontal direction parallel to a waveguide and a value of about 30° in a vertical direction perpendicular to the waveguide. Accordingly, a horizontal to vertical aspect ratio is about 2 to 4. Unless this aspect ratio is improved to be approximately 1, light quantity is lost without efficiently introducing a laser light to the optical system upon the coupling to the fiber.

In order to improve the aspect ratio, the laser beam of the excitation light 71 emitted from the laser chip 70 may be shaped. An example of beam shaping using a cylindrical lens 72 is shown in FIG. 12A. It can be seen in FIG. 12A that a divergent angle in the vertical direction of the excitation light 71 emitted from the laser chip 70 is narrowed by the cylindrical lens 72 for narrowing the beam in the vertical direction. This beam-shaped excitation light 71 is converted into a parallel light by a collimator lens 73 without any loss of the light quantity in the vertical and horizontal directions. At this time, the laser chip 70 is soldered to a submount 74 made of, e.g. AlN and having a good heat radiating property, and this submount 74 is bonded to a metal base 75 by Au paste having high thermal conduction. In other words, heat generated by the laser chip 70 is efficiently radiated to a package or container by means of the submount 74 and the like, thereby suppressing a temperature increase by the heat generation in the laser chip 70. Further, the cylindrical lens 72 and the collimator lens 73 are supported by an insulating holder 76, which is fixed to the metal base 75 by adhesive or the like.

Another example of beam shaping using a lens fiber 77 provided with a cylindrical lens function is shown in FIG. 12B. It can be seen in FIG. 12B that a divergent angle in the vertical direction of the excitation light 71 emitted from the laser chip 70 is narrowed by the lens fiber 77 provided with the cylindrical lens function for narrowing the beam in the vertical direction. The excitation light 71 beam-shaped by a tapered leading end 78 of this lens fiber 77 is collimated by a main part of the lens fiber 77 to be converted into a parallel light without any loss of the light quantity. At this time, as in FIG. 12A, the laser chip 70 is soldered to a submount 74 made of, e.g. AlN and having a good heat radiating property, and this submount 74 is bonded to a metal base 75 by Au paste having high thermal conduction. Further, the cylindrical lens 72 and the collimator lens 73 are supported by an insulating holder 76, which is fixed to the metal base 75 by adhesive or the like.

As described above, since the optical element can be proximately arranged at a distance of several mm or shorter from the laser chip 70 shown in FIGS. 12A and 12B, the laser chip 70 and the optical system can be compactly accommodated in a small-size package provided with the metal base having a good heat radiating property. A metal container of the package at this time may be used as the metal base. The package needs a shield from the outside at least for dust prevention, e.g. needs to be shielded by a metallic cap fitted with transparent glass. At this time, by purging the interior of the package in a nitrogen atmosphere containing about 5% of hydrogen, carbon production resulting from the burning of dust inside the package by the laser beam can be suppressed.

Figure 13:
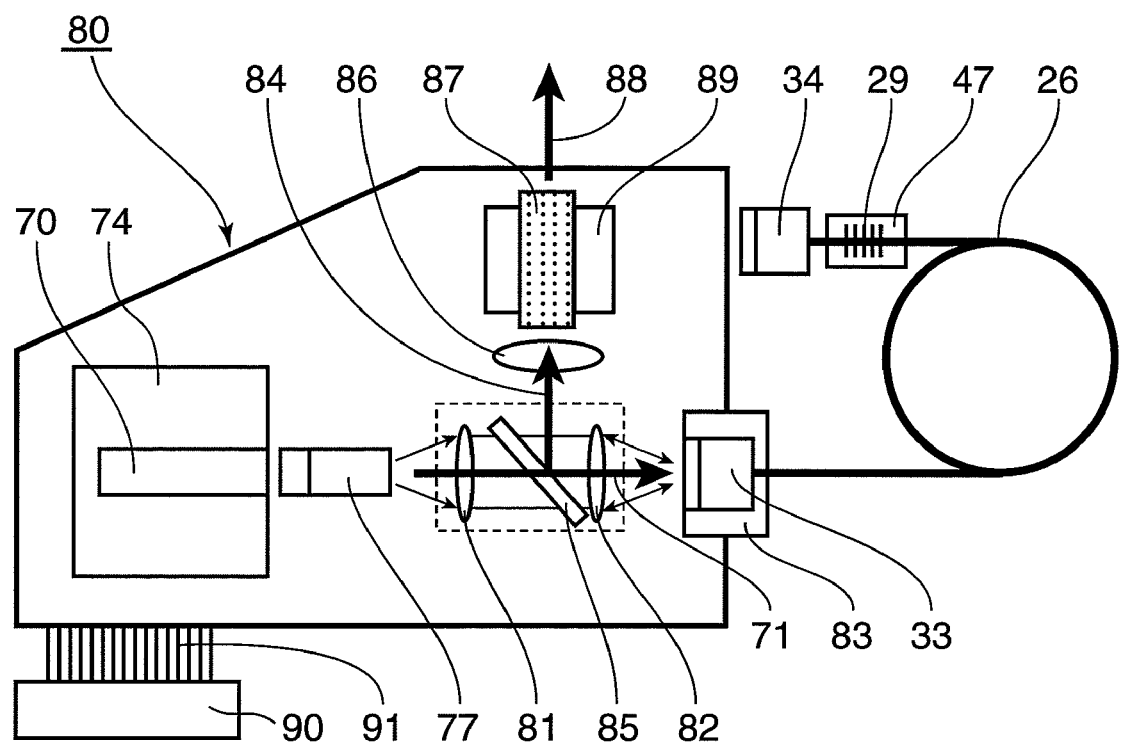
FIG. 13 is a diagram showing a module construction of the wavelength converter according to the fourth embodiment of the invention when viewed from above.

Further, as shown in FIG. 13, a module including the optical system for coupling to the fiber and the wavelength conversion element in addition to the construction of the excitation laser light source of FIG. 12A or 12B may be compactly accommodated in the same container.

FIG. 13 is a diagram showing the internal construction of a module 80 when viewed from above. Parts mainly arranged in the module 80 are described below. An excitation light 71 is, for example, beam-shaped by a lens fiber 77 to be converted into a parallel light here after being emitted from a laser chip 70. This excitation light 71 is condensed by the condenser lens 82 to be incident on a fiber 26 after passing through the lens fiber 77 and the collimator lens 81. At this time, the fiber 26 including a second reflection surface 33 is fixed by a fiber holder 83 provided in the module 80. A fundamental wave 84 undergoing laser oscillation in the fiber 26 passes through the condenser lens 82 after emerging from the second reflection surface 33 of the fiber 26, and is condensed by a condenser lens 86 to a wavelength conversion element 87 to be converted into a harmonic output 88 after being reflected by an extraction mirror 85. This harmonic output 88 becomes an output of the module 80. A fin for cooling (not shown) is attached to the wavelength conversion element 87 and, in addition, a Peltier element 89 for temperature control is attached. A fan (not shown) for cooling the Peltier element 89 for cooling the laser chip 70 and the wavelength conversion element 88 is attached to the module 80. It is also possible to control the elements and parts in the module 80 by a module controller 90 via input/output lines 91.

If the laser chip and the lens are proximately arranged in the container in this way, the laser light source can be made smaller and, further, the parts other than the fiber can be compactly formed into the module as shown in FIG. 13, a smaller and lighter wavelength converter can be realized and the module can be exchanged in the case of trouble. Thus, complicated optical adjustments can be simplified and the interior of the module can be kept clean. Therefore, dust deposition on the wavelength conversion element 87 and the optical system including the lenses due to laser trapping can be prevented to improve reliability.

Although the arrangement of light receiving elements, temperature sensors and Peltier elements are not sufficiently shown here, necessary numbers of them may be arranged at necessary positions as shown in the third embodiment of FIG. 11.

An output controller, an excitation laser current source and the like are not shown, either, but all the parts and devices necessary for the wavelength converter are arranged and the entire wavelength converter is controlled by the output controller.

Although the excitation light of the excitation laser is beam-shaped using the cylindrical lens or lens fiber in this embodiment, an other optical component capable of beam shaping, e.g. a beam shaping prism or a concave lens may also be used.

Fifth Embodiment

Figure 14:
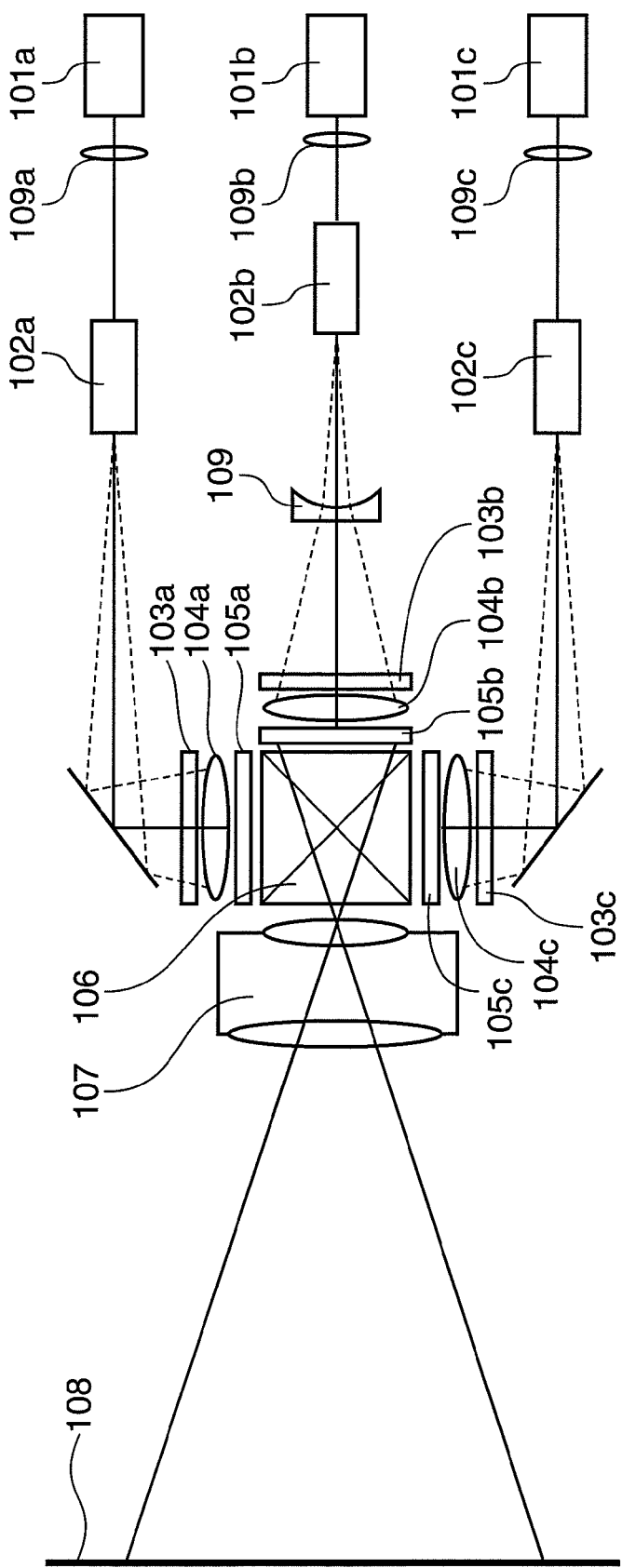
FIG. 14 is a schematic diagram showing the construction of a two-dimensional image display device according to a fifth embodiment of the invention.

FIG. 14 shows an exemplary construction of a laser display (two-dimensional image display device) according to a fifth embodiment of the present invention, to which the wavelength converters shown in the above first to fourth embodiments are applicable. Laser light sources 101a, 101b and 101c of three colors of red (R), green (G) and blue (B) are used as light sources. An AlGaInP/GaAs semiconductor laser having a wavelength of 638 nm is used as the red laser light source (R-light source) 101a and a GaN semiconductor laser having a wavelength of 465 nm is used as the blue laser light source (B-light source) 101c.

On the other hand, the wavelength converter shown in the first to fourth embodiment and including the wavelength conversion element for halving the wavelength of an infrared laser light is used as the green laser light source (G-light source) 101b. Laser beams emitted from the respective light sources 101a, 101b and 101c are scanned on diffuser plates 103a, 103b and 103c by reflective two-dimensional beam scanning means 102a, 102b and 102c after being condensed by condenser lenses 109a, 109b and 109c. An image data is split into data of R, G, B and signals of the respective data are multiplexed to form a color image by a dichroic prism 106 after being narrowed by field lenses 104a, 104b and 104 and inputted to spatial modulation elements 105a, 105b and 105c. The image multiplexed in this way is projected onto a screen 108 by a projection lens 107. A concave lens 109 for setting the spot size of a G-light in the spatial modulation element 105b equal to those of R- and B-lights is inserted in an optical path along which the G-light from the G-light source 101b is incident on the spatial modulation element 105b.

Although each of the R-light source and the B-light source is constructed using one semiconductor laser in this embodiment, it may be constructed such that outputs of a plurality of semiconductor lasers can be collectively obtained in one fiber such as a bundle fiber. By doing so, the wavelength spectral widths of the R- and B-light sources can be increased to relax coherence and these light sources can suppress speckle noise. Similarly, for the G-light source, G-light outputs of a plurality of wavelength converters may be respectively guided by output fibers and these output fibers may be collected as one fiber such as a bundle fiber, thereby making the G-light source have a suppressed level of speckle noise.

The diffuser plates, a lenticular lens and the like are arranged before a two-dimensional spatial modulator. Such an arrangement of the members is for removing speckle noise generated by using strong coherent laser beams as the light sources. By swinging these speckle noise removing means, speckle noise seen during the response time of human eyes can be reduced. In other words, in this embodiment, the wavelength converter for generating a second harmonic output by causing a fundamental wave emitted from the fiber laser to be incident on the wavelength conversion element is used as the G-light source 101b. In the construction of the laser display, this wavelength converter is characteristic.

Since the laser display of this embodiment uses the laser light sources as the R-, G- and B-light sources as described above, it can have a high luminance and a thin construction. Further, since the wavelength converter including the fiber laser is used as the G-light source and the fiber length can be half that of the conventional one as also described in this embodiment, a smaller, lighter and lower power consuming laser display can be realized. In addition, since the wavelength converter of this embodiment has a short fiber length and can suppress the absorption of the fundamental wave, green laser light sources having shorter wavelengths than before, e.g. green laser light sources having wavelengths of 532 nm, 510 nm and 540 nm can be outputted. Thus, the color reproduction range can be extended from that of the conventional SRGB standards shown in FIG. 15, for example, to the range of 510 nm, whereby color reproduction closer to original colors is possible. In other words, the laser display of this embodiment can have an extended color reproduction range than conventional laser displays.

Besides the two-dimensional image display device thus constructed, lights may be projected from behind a screen (rear projection display).

Although the reflective spatial modulation elements integrated with micromirrors are used in FIG. 14, modulation elements using liquid crystal or two-dimensional modulation elements using galvanometer mirrors or mechanical microswitches (MEMSs) can also be used.

In the case of using the reflective spatial modulation elements as in this embodiment or light modulation elements having a little influence of polarizing components on a light modulation characteristic such as MEMSs and galvanometer mirrors, a fiber for propagating a harmonic needs not be a polarization maintaining fiber such as a PANDA (polarization-maintaining and absorption-reducing) fiber. However, upon using two-dimensional modulation devices using liquid crystal, it is preferable to use polarization maintaining fibers since a modulation characteristic and a polarization characteristic are largely related.

Although the fiber laser is doped with the rare earth element Yb in the above first to fifth embodiments, other rare earth element(s), e.g. at least one selected from Nd, Er, etc. may be used. The doped amount of the rare earth element may be changed or a plurality of rare earth elements may be doped depending on the wavelength and output of the wavelength converter.

Although the laser having a wavelength of 915 nm or 976 nm is used as the excitation laser light source of the fiber laser in the above first to fifth embodiments, a laser light source having any other wavelength may also be used provided that it can excite the fiber laser.

Although the MgO:LiNbO$_3$ with the periodic poled structure is used as the wavelength conversion element in the above first to fifth embodiments, a wavelength conversion element may be made of another material and/or have another structure, e.g. made of potassium titanyl phosphate (KTiOPO$_4$:KTP) or Mg:LiTaO$_3$ having a periodic poled structure.

As described above, according to the wavelength converter of the present invention, an excitation light incident on the fiber generates a seed light of a fundamental wave by being absorbed during a round trip in the fiber and the seed light of the fundamental wave is amplified by this excitation light to oscillate and becomes a high-output fundamental wave. Since the fiber laser efficiently absorbs the excitation light using the fiber having half the length of the conventional one and the fundamental wave is oscillated with a high gain and efficiently emerges from the extraction mirror, the wavelength converter can be constructed to have a smaller size, high efficiency and lower power consumption. Since a larger amount of the fundamental wave is fed back by the fiber grating as compared with the conventional construction, a large section for amplifying the fundamental wave can be ensured and a highly efficient and lower power consuming fiber laser light source can be constructed. Since fundamental waves of around 1030 nm, with which outputs exceeding 5 W were difficult to generate in the conventional construction, can also be generated, the wavelength converter of the present invention can output W-class green laser lights having short wavelengths of around 510 nm.

Since the excitation light can be uniformly absorbed in the fiber, there are great effects of having no damages by the laser lights, being able to stably output a W-class visible laser light from the wavelength converter and being able to emit a green laser light having a high luminosity factor.

Since the excitation light is entirely absorbed in the fiber, fiber deterioration caused by the absorption of the excitation light, which is not absorbed by the connected part of the fiber as in the prior art, and the like can be prevented, whereby the reliabilities of the fiber laser and the wavelength converter can be improved.

The two-dimensional image display device of the present invention using the wavelength converter having such characteristics has great effects of having a thin construction, high efficiency and lower power consumption in addition to a high luminance, a wide color reproduction range and a high image quality.

The present invention is summarized as follows from the above respective embodiments. Specifically, a wavelength converter according to the present invention comprises a laser resonator including a fiber containing a laser active material and formed with a fiber grating; a laser light source for emitting an excitation light to the fiber; and a wavelength conversion element for converting a fundamental wave of a laser light emerging from the laser resonator into a harmonic, wherein the laser resonator includes a first reflection surface arranged near the fiber grating and a second reflection surface arranged near the laser light source; and the excitation light emitted from the laser light source makes a round trip between the second and first reflection surfaces by being reflected by the first reflection surface after being incident through the second reflection surface.

In the above wavelength converter, the excitation light incident on the fiber from the laser light source is reflected by the first reflection surface of the fiber to make a round trip in the fiber after being incident on the second reflection surface of the fiber, thereby being efficiently absorbed by an energy level involving the laser active material. Conventionally, the fiber laser has needed to have such a length as to substantially entirely absorb the excitation light but, by reflecting the excitation light in the fiber laser, the excitation light is absorbed with half the length. Thus, the fiber laser efficiently absorbs the excitation light with half the length of the conventional one and oscillates the fundamental wave with a high gain to efficiently emit the fundamental wave, wherefore the wavelength converter can be constructed to have a small construction, high efficiency and lower power consumption.

Further, in the above wavelength converter, the excitation light can be mostly absorbed with half the length of the conventional one and, simultaneously, the absorption is halved in proportion to the fiber length. Thus, the fundamental wave of the fiber laser can be outputted as a high-output laser light even at a short wavelength side near 1030 nm where a large amount of light is absorbed. As a result, if a fundamental wave having a shorter wavelength than usual is used as an incident light, the wavelength of a harmonic having a shorter wavelength than usual, e.g. a green laser light having a high luminosity factor and a wavelength of around 515 nm, can be outputted as a W-class light output from the wavelength conversion element.

By arranging the first reflection surface at the other end of the fiber, the number of optical components such as a lens and a mirror for propagating the light between the fiber and the first reflection surface can be reduced and adjustments become unnecessary, wherefore cost reduction and reliability improvement can be accomplished.

By providing the second reflection surface at one end of the fiber, the fundamental wave can be efficiently extracted.

Preferably, the wavelength converter further comprises a light propagating portion for propagating the excitation light emitted from the laser light source to the one end of the fiber and propagating the fundamental wave of the laser light emerging from the laser resonator to the wavelength conversion element.

In this case, the fundamental wave can be efficiently propagated to the wavelength conversion element since the fundamental wave of the laser light does not return to the laser light source.

The light propagating portion preferably includes a reflecting member for transmitting the excitation light emitted from the laser light source and reflecting the fundamental wave of the laser light emerging from the laser resonator.

In this case, the fundamental wave can be extracted by a simple construction.

A wavelength selecting layer for transmitting the excitation light emitted from the laser light source and reflecting the fundamental wave of the laser light emerging from the laser resonator is preferably formed on a surface of the reflecting member.

In this case, the high-output fundamental wave from the fiber laser is reflected by the wavelength selecting layer and is not incident on the laser light source for emitting the excitation light. Thus, the damage of the laser light source by the incidence of the fundamental wave can be further prevented.

The reflecting member preferably includes a narrow band transmission filter.

In this case, the half width of the wavelength of the excitation light becomes smaller, the excitation light is more efficiently absorbed by the fiber laser and light conversion from the excitation light into the fundamental wave can be realized with higher efficiency.

Preferably, the above wavelength converter further comprises a diffraction member for diffracting only light components having wavelengths in a specified narrow band out of the excitation light reflected by the reflecting member after being emitted from the laser light source, and the diffracted light by the diffraction member returns to the laser light source to fix an oscillation wavelength of the laser light source to the wavelength of the diffracted light by the diffraction member.

In this case, the excitation light is more efficiently absorbed in the fiber laser by fixing the wavelength, at which the absorption is large in the fiber laser, as the wavelength of the excitation light.

The diffraction member preferably includes a reflective diffraction grating for reflecting an incident light.

In this case, a light of a desired wavelength can be diffracted only by adjusting one diffraction grating, wherefore an adjustment for wavelength selection can be easily controlled.

The diffraction member preferably includes a transmissive diffraction grating for transmitting an incident light and a reflection mirror for reflecting the light transmitting the diffraction grating.

In this case, the range of diffractable wavelengths can be extended since the transmissive diffraction grating is used. Further, since an adjustment is made by combining the diffraction grating and the reflection mirror, the wavelength selection and an emission direction of the diffracted light can be independently controlled.

The fiber is preferably such that a first fiber and a second fiber formed with the fiber grating are optically connected.

In this case, optimal first fiber for absorbing the excitation light and optimal second fiber for selecting the wavelength of the fundamental wave can be used while being individually combined according to their respective functions.

The first reflection surface is preferably formed by a multilayer film.

In this case, the first reflection surface can reflect the excitation light at a reflectance substantially approximate to total reflection, whereby the excitation light can be more efficiently utilized.

The second reflection surface is preferably formed by a polarizing mirror.

In this case, a polarizing surface of an optical system can be more easily adjusted.

The wavelength selecting layer of the reflecting member is preferably formed by a multilayer film.

In this case, there can be realized a reflecting member having a further reduced loss by light absorption and a further improved property of selecting the wavelengths of the excitation light and the fundamental wave.

The laser light source preferably includes a laser element for emitting the excitation light, a lens for beam-shaping the excitation light emitted from the laser element and a container for storing the laser element and the lens.

In this case, the optical system for introducing the excitation light emitted from the laser light source to the fiber laser can have a smaller size and higher coupling efficiency.

The lens is preferably a cylindrical lens.

In this case, the excitation light emitted from the laser light source has the aspect ratio thereof improved without reducing the light quantity and can be made easily optically coupled to the fiber laser. Thus, the excitation light can be more efficiently utilized.

The wavelength bandwidth of the narrow band transmission filter is preferably 0.1 nm or shorter.

In this case, the wavelength conversion efficiency of the wavelength conversion element can be improved by narrowing the band of the fundamental wave.

The reflectances of the fiber grating and the first reflection surface preferably satisfy a relationship that the reflectance of the fiber grating is smaller than that of the first reflection surface for the wavelength of the excitation light emitted from the laser light source and satisfy a relationship that the reflectance of the fiber grating is larger than that of the first reflection surface for the wavelength of the fundamental wave emerging from the laser resonator.

In this case, it can be realized that the fundamental wave resonates between the fiber grating and the second reflection surface and, on the other hand, the excitation light passes through the fiber grating to be reflected by the first reflection surface.

Since the fiber grating is set to have a high reflectance for the fundamental wave, the fundamental wave substantially entirely emerges from the second reflection surface to be incident on the wavelength conversion element. The incident fundamental wave is converted into a harmonic in the wavelength conversion element and a W-class green laser light is outputted from the wavelength conversion element. By increasing a feedback amount of the fundamental wave, a large section for amplifying the fundamental wave generated in the fiber laser can be ensured and a fiber laser light source more efficient than in the case of reflecting the excitation light can be constructed.

If the first reflection surface is set to have a reflectance approximate to total reflection for the excitation light, the excitation light is present with a high light density in the fiber laser and efficiently absorbed at the energy level involving the laser active material. Thus, the fiber laser comes to have a high gain for oscillating the fundamental wave. If a seed light of the fundamental wave is generated in the fiber laser under such a condition, it is amplified with a high gain and is wavelength-selected by the fiber grating, wherefore a high-output fundamental wave having a desired wavelength can be obtained.

The reflectance of the second reflection surface is preferably 10 to 20%.

In this case, the fundamental wave from the fiber can be efficiently extracted through the second reflection surface while abnormal oscillation between the light propagating portion and the second reflection surface is suppressed.

The wavelength converter preferably further comprises a fundamental wave detector for detecting a part of the output of the fundamental wave and an output controller for controlling the output of the harmonic output emerging from the wavelength conversion element based on a detection value by the fundamental wave detector.

In this case, a phase-matching condition of the fundamental wave in the wavelength conversion element can be accurately controlled and a stable harmonic output can be more efficiently obtained from the wavelength conversion element by controlling temperature increases in the fiber grating and the wavelength conversion element resulting from an increase of the fundamental wave output.

The output controller preferably stores a table inputted beforehand and controls the temperature of at least one of the fiber grating and the wavelength conversion element based on the table.

In this case, a laser output after the wavelength conversion can be more effectively controlled to a W-class high output by enabling reference to the table defining a quantitative relationship between the fundamental wave output as the input to the wavelength conversion element and the harmonic output after the wavelength conversion as the output of the wavelength conversion element.

The table preferably includes data on a phase-matching wavelength change amount in the wavelength conversion element in relation to the fundamental wave output.

In this case, the phase-matching condition of the wavelength conversion element is quickly adjusted through the temperature controls of the fiber grating and the wavelength conversion element for the output and wavelength of the fundamental wave based on the above data when the fundamental wave output changes. As a result, the phase-matching condition is quickly satisfied and the harmonic output from the wavelength conversion element is more stably maintained.

The table preferably includes data on a reflection wavelength change amount of the fundamental wave in the fiber grating in relation to the fundamental wave output.

In this case, the phase-matching condition of the wavelength conversion element is quickly adjusted through the temperature controls of the fiber grating and the wavelength conversion element for the output and wavelength of the fundamental wave based on the above data when the fundamental wave output changes. As a result, the phase-matching condition is quickly satisfied and the harmonic output from the wavelength conversion element is more stably maintained.

The fundamental wave detector preferably includes a light receiving element for receiving a light branched from the fundamental wave in the fiber.

In this case, the harmonic output from the wavelength converter can be more stably maintained by precisely detecting the fundamental wave output and stably controlling the fundamental wave output.

The fundamental wave detector preferably includes a light receiving element for receiving a leakage light of the fundamental wave in the fiber grating.

In this case, the harmonic output from the wavelength converter can be more stably maintained by precisely detecting the fundamental wave output and stably controlling the fundamental wave output.

The fundamental wave detector preferably includes a light receiving element for receiving the fundamental wave output having passed through the first reflection surface.

In this case, the harmonic output from the wavelength converter can be more stably maintained by precisely detecting the fundamental wave output and stably controlling the fundamental wave output.

The output controller preferably controls the fundamental wave output by causing the reflecting member to reflect the excitation light and detecting a part of the excitation light by means of a light receiving element.

In this case, the harmonic output from the wavelength converter can be more stably maintained by precisely detecting the fundamental wave output and stably controlling the fundamental wave output.

Preferably, the wavelength of the harmonic output is 510 to 540 nm and the output of the harmonic output is 1 W or higher.

In this case, a green laser output light having a high luminosity factor can be obtained, and color representation close to original colors can be made as a display with good color reproducibility.

An image display device according to the present invention comprises a plurality of laser light sources; a scanning unit for scanning laser lights emitted from the respective laser light sources; and a screen for displaying an image using the laser lights emitted from the respective laser light sources, wherein the laser light sources include light sources for emitting at least red, green and blue lights and, out of the laser light sources, at least the green light source includes the above wavelength converter.

The above image display device can be used as a display or the like having good color reproducibility to enable color reproduction closer to original colors since a green laser output light having a high luminosity factor can be obtained.

INDUSTRIAL APPLICABILITY

A wavelength converter and an image display device according to the present invention are useful in the display field including large-size displays and high-luminance displays since having a high luminance, a wide color reproduction range and lower power consumption.

What is claimed is:
1. A wavelength converter, comprising:
    a laser resonator including a fiber containing a laser active material and formed with a fiber grating;
    a laser light source for emitting an excitation light to the fiber; and
    a wavelength conversion element for converting a fundamental wave of a laser light emerging from the laser resonator into a harmonic,
    wherein:
    the laser resonator includes a first reflection surface arranged near the fiber grating and a second reflection surface arranged near the laser light source;

the fundamental wave of the laser light emerging from the laser resonator reciprocates between the fiber grating and the second reflection surface, the excitation light emitted from the laser light source makes a round trip between the second and first reflection surfaces by being reflected by the first reflection surface after being incident through the second reflection surface, and the reflectances of the fiber grating and the first reflection surface satisfy a relationship that the reflectance of the fiber grating is larger than that of the first reflection surface for the wavelength of the fundamental wave and satisfy a relationship that the reflectance of the fiber grating is smaller than that of the first reflection surface for the wavelength of the excitation light.

2. A wavelength converter according to claim 1, further comprising a light propagating portion for propagating the excitation light emitted from the laser light source to the second reflection surface and propagating the fundamental wave of the laser light emerging from the laser resonator to the wavelength conversion element.

3. A wavelength converter according to claim 2, wherein the light propagating portion includes a reflecting member for transmitting the excitation light emitted from the laser light source and reflecting the fundamental wave of the laser light emerging from the laser resonator.

4. A wavelength converter according to claim 3, wherein a wavelength selecting layer for transmitting the excitation light emitted from the laser light source and reflecting the fundamental wave of the laser light emerging from the laser resonator is formed on a surface of the reflecting member.

5. A wavelength converter according to claim 4, wherein the wavelength selecting layer of the reflecting member is formed by a multilayer film.

6. A wavelength converter according to claim 3, wherein the reflecting member includes a narrow band transmission filter.

7. A wavelength converter according to claim 6, wherein the wavelength bandwidth of the narrow band transmission filter is 0.1 nm or shorter.

8. A wavelength converter according to claim 3, further comprising a diffraction member for diffracting only light components having wavelengths in a specified narrow band out of the excitation light reflected by the reflecting member after being emitted from the laser light source, wherein the diffracted light by the diffraction member returns to the laser light source to fix an oscillation wavelength of the laser light source to the wavelength of the diffracted light by the diffraction member.

9. A wavelength converter according to claim 8, wherein the diffraction member includes a reflective diffraction grating for reflecting an incident light.

10. A wavelength converter according to claim 8, wherein the diffraction member includes a transmissive diffraction grating for transmitting an incident light and a reflection mirror for reflecting the light transmitting the diffraction grating.

11. A wavelength converter according to claim 2, further comprising a fundamental wave detector for detecting a part of the output of the fundamental wave and an output controller for controlling the output of the harmonic output emerging from the wavelength conversion element based on a detection value by the fundamental wave detector.

12. A wavelength converter according to claim 11, wherein the output controller stores a table inputted beforehand and controls the temperature of at least one of the fiber grating and the wavelength conversion element based on the table.

13. A wavelength converter according to claim 12, wherein the table includes data on a phase-matching wavelength change amount in the wavelength conversion element in relation to the fundamental wave output.

14. A wavelength converter according to claim 12, wherein the table includes data on a reflection wavelength change amount of the fundamental wave in the fiber grating in relation to the fundamental wave output.

15. A wavelength converter according to claim 11, wherein the fundamental wave detector includes a light receiving element for receiving a light branched from the fundamental wave in the fiber.

16. A wavelength converter according to claim 11, wherein the fundamental wave detector includes a light receiving element for receiving a leakage light of the fundamental wave in the fiber grating.

17. A wavelength converter according to claim 11, wherein the fundamental wave detector includes a light receiving element for receiving the fundamental wave output having passed through the first reflection surface.

18. A wavelength converter according to claim 11, wherein the output controller controls the fundamental wave output by causing the light propagating portion to reflect the excitation light and detecting a part of the excitation light by means of a light receiving element.

19. A wavelength converter according to claim 1, wherein the fiber is such that a first fiber and a second fiber formed with the fiber grating are optically connected.

20. A wavelength converter according to claim 1, wherein the first reflection surface is formed by a multilayer film.

21. A wavelength converter according to claim 1, wherein the second reflection surface is formed by a polarizing mirror.

22. A wavelength converter according to claim 1, wherein the laser light source includes a laser element for emitting the excitation light, a lens for beam-shaping the excitation light emitted from the laser element and a container for storing the laser element and the lens.

23. A wavelength converter according to claim 22, wherein the lens is a cylindrical lens.

24. A wavelength converter according to claim 1, wherein the reflectance of the second reflection surface is 10 to 20%.

25. A wavelength converter according to claim 1, wherein the wavelength of the harmonic output is 510 to 540 nm and the output of the harmonic output is 1 W or higher.

26. A wavelength converter according to claim 1, wherein the wavelength of the fundamental wave is 1020 to 1060 nm and the wavelength bandwidth of the fiber grating is 0.05 nm or shorter.

27. An image display device, comprising:
a plurality of laser light sources;
a scanning unit for scanning laser lights emitted from the respective laser light sources; and
a screen for displaying an image using the laser lights emitted from the respective laser light sources,
the laser light sources including light sources for emitting at least red, green and blue lights,
wherein, out of the laser light sources, at least the green light source includes a wavelength converter according to claim 1.

* * * * *